(12) United States Patent
Nakashima et al.

(10) Patent No.: US 7,772,486 B2
(45) Date of Patent: Aug. 10, 2010

(54) PHOTOVOLTAIC DEVICE

(75) Inventors: Takeshi Nakashima, Kobe (JP); Eiji Maruyama, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 905 days.

(21) Appl. No.: 11/002,810

(22) Filed: Dec. 3, 2004

(65) Prior Publication Data

US 2005/0150543 A1    Jul. 14, 2005

(30) Foreign Application Priority Data

Jan. 13, 2004   (JP) .............................. 2004-004982

(51) Int. Cl.
*H01L 31/00* (2006.01)
*H01L 33/00* (2010.01)

(52) U.S. Cl. ............... 136/256; 136/261; 136/258; 136/252; 257/98; 257/51; 257/64

(58) Field of Classification Search ................ 136/256, 136/261, 258, 252; 428/432; 257/98, 51, 257/64; 438/98, 64
See application file for complete search history.

(56) References Cited

U.S. PATENT DOCUMENTS

| 3,350,775 | A | * | 11/1967 | Iles | 438/98 |
|---|---|---|---|---|---|
| 3,411,952 | A | * | 11/1968 | Ross et al. | 136/244 |
| 3,489,615 | A | * | 1/1970 | Mann | 136/256 |
| 4,070,206 | A | * | 1/1978 | Kressel et al. | 136/255 |
| 4,171,989 | A | * | 10/1979 | Pryor | 136/256 |
| 4,320,247 | A | * | 3/1982 | Gatos et al. | 136/255 |
| 4,343,963 | A | * | 8/1982 | Thomas | 136/258 |
| 4,361,950 | A | * | 12/1982 | Amick | 438/98 |
| 4,416,052 | A | * | 11/1983 | Stern | 438/64 |
| 4,542,258 | A | * | 9/1985 | Francis et al. | 136/256 |
| 4,543,443 | A | * | 9/1985 | Moeller et al. | 136/256 |
| 4,543,444 | A | * | 9/1985 | Rasch et al. | 136/256 |
| 4,694,115 | A | * | 9/1987 | Lillington et al. | 136/256 |
| 4,697,041 | A | * | 9/1987 | Okaniwa et al. | 136/244 |
| 4,719,152 | A | | 1/1988 | Ohta et al. | |
| 4,808,242 | A | * | 2/1989 | Murata et al. | 136/244 |
| 5,017,243 | A | * | 5/1991 | Otsubo | 136/244 |

(Continued)

FOREIGN PATENT DOCUMENTS

EP    0 763 858 A2    3/1997

(Continued)

OTHER PUBLICATIONS

Banerjee et al. ("Synthesis and characterization of p-type transparent conducting CuAlO2 thin film by DC sputtering", Thin Solid Films, vol. 440, (2003) pp. 5-10).*

(Continued)

*Primary Examiner*—Alexa D Neckel
*Assistant Examiner*—Golam Mowla
(74) *Attorney, Agent, or Firm*—McDermott Will & Emery LLP

(57) ABSTRACT

The present invention provides a photovoltaic device capable of keeping reduction of the yield in modularization in check. This photovoltaic device comprises a transparent conductive film, and a collector which is formed on the surface of the transparent conductive film so as to be in partial contact with a semiconductor layer.

8 Claims, 12 Drawing Sheets

U.S. PATENT DOCUMENTS

| | | | |
|---|---|---|---|
| 5,053,083 A * | 10/1991 | Sinton | 136/256 |
| 5,145,793 A * | 9/1992 | Oohara et al. | 438/94 |
| 5,178,685 A * | 1/1993 | Borenstein et al. | 136/244 |
| 5,268,039 A * | 12/1993 | Vogeli et al. | 136/256 |
| 5,328,520 A * | 7/1994 | Itagaki | 136/256 |
| 5,480,494 A * | 1/1996 | Inoue | 136/251 |
| 5,620,904 A * | 4/1997 | Hanoka | 438/98 |
| 5,697,192 A * | 12/1997 | Inoue | 52/173.3 |
| 5,792,280 A * | 8/1998 | Ruby et al. | 136/258 |
| 5,942,048 A * | 8/1999 | Fujisaki et al. | 136/256 |
| 5,973,258 A * | 10/1999 | Shiotsuka et al. | 136/252 |
| 6,051,778 A * | 4/2000 | Ichinose et al. | 136/256 |
| 6,080,928 A * | 6/2000 | Nakagawa | 136/249 |
| 6,091,019 A * | 7/2000 | Sakata et al. | 136/256 |
| 6,121,542 A * | 9/2000 | Shiotsuka et al. | 136/256 |
| 6,127,622 A * | 10/2000 | Yamada et al. | 136/251 |
| 6,472,594 B1 | 10/2002 | Ichinose et al. | |
| 6,846,984 B2 * | 1/2005 | Fath et al. | 136/256 |
| 2002/0056473 A1 * | 5/2002 | Chandra et al. | 136/256 |
| 2003/0062081 A1 * | 4/2003 | Maruyama et al. | 136/258 |
| 2003/0178630 A1 * | 9/2003 | Maruyama | 257/98 |
| 2004/0261838 A1 * | 12/2004 | Cotal et al. | 136/256 |
| 2005/0126619 A1 * | 6/2005 | Abe et al. | 136/244 |
| 2005/0126625 A1 * | 6/2005 | Yamamoto et al. | 136/256 |

FOREIGN PATENT DOCUMENTS

| | | | |
|---|---|---|---|
| EP | 1 300 889 A2 | | 4/2003 |
| JP | 60-024078 | | 2/1985 |
| JP | 60-240164 | | 11/1985 |
| JP | 61-129881 | | 6/1986 |
| JP | 10-275926 | | 10/1998 |
| JP | 11-312813 A | * | 11/1999 |
| JP | 2001-127314 | | 5/2001 |
| JP | 2001127314 A | * | 5/2001 |
| JP | 2002026345 A | * | 1/2002 |
| JP | 2003-197943 | | 7/2003 |

OTHER PUBLICATIONS

Chinese Notification of Fourth Office Action, with English Translation thereof, issued in Chinese Patent Application No. 2004100866195 dated Mar. 27, 2009.

Japanese Notification of Reason(s) for Rejection, w/ English translation thereof, issued in Japanese Patent Application No. 2004-282966 dated on Jul. 29, 2008.

* cited by examiner

PHOTOVOLTAIC DEVICE

BACKGROUND OF THE INVENTION

1. Field of the Invention

The present invention relates to a photovoltaic device, and more particularly to a photovoltaic device having a collector.

2. Description of the Background Art

A photovoltaic device having a transparent conductive film formed on the surface of a semiconductor layer and a collector formed on the surface of the transparent conductive film is known in general. For example, Japanese Patent Laying-Open No. 2003-197943 discloses this type of photovoltaic device.

FIG. 23 is an enlarged perspective view partially showing the structure of a conventional photovoltaic device having a constitution similar to the photovoltaic device disclosed in the above Japanese Patent Laying-Open No. 2003-197943. FIG. 24 is a plan view showing the whole constitution of the exemplary conventional photovoltaic device shown in FIG. 23. FIG. 23 shows the structure of a region 601a surrounded by a dashed line in FIG. 24. Referring to FIGS. 23 and 24, in the exemplary conventional photovoltaic device 601, a substantially intrinsic i-type amorphous silicon layer 603 and a p-type amorphous silicon layer 604 are successively formed on the upper surface of an n-type single-crystalline silicon substrate 602. A transparent conductive film 605 is formed on a prescribed region of the p-type amorphous silicon layer 604. A topside collector 606 is formed on a prescribed region of the upper surface of the transparent conductive film 605. This topside collector 606 is formed so as to be in contact only with the upper surface of the transparent conductive film 605. The topside collector 606 is composed of a plurality of comb-shaped electrode portions 606a formed so as to extend in parallel to each other and spaced from each other at a prescribed interval and a bus bar electrode portion 606b aggregating currents flowing in the comb-shaped electrode portions 606a. A substantially intrinsic i-type amorphous silicon layer 607 and an n-type amorphous silicon layer 608 are successively formed on the lower surface of the n-type single-crystalline silicon substrate 602. A transparent conductive film 609 is formed on the lower surface of the n-type amorphous silicon layer 608. A backside collector 610 composed of a plurality of comb-shaped electrode portions 610a and a bus bar electrode portion (not shown) is formed on the lower surface of the transparent conductive film 609. This backside collector 610 is formed so as to be in contact only with the lower surface of the transparent conductive film 609.

However, in the exemplary conventional photovoltaic device shown in FIG. 23, the topside collector 606 is formed so as to be in contact only with the transparent conductive film 605. Accordingly, when adhesive strength between the topside collector 606 and the transparent conductive film 605 is small, there is a disadvantage that the topside collector 606 may be peeled off due to an applied stress in an attachment process of a tab (electric wire) to the topside collector 606 or an external force applied through the attached tab. Since the backside collector 610 is also in contact with only the transparent conductive film 609, there is a disadvantage that the backside collector 610 may be peeled off similarly to the topside collector 606. Consequently, there is a problem that the yield is reduced in modularization of a plurality of photovoltaic devices by connecting them with tabs.

SUMMARY OF THE INVENTION

The present invention is aimed at solving the above problems, and it is one object of the present invention to provide a photovoltaic device capable of keeping reduction of the yield in modularization in check.

To achieve the above object, a photovoltaic device according to a first aspect of the invention comprises a semiconductor layer, a transparent conductive film formed on the surface of the semiconductor layer, and a collector which is formed on the surface of the transparent conductive film so as to be in partial contact with a semiconductor layer.

In the photovoltaic device according to the first aspect, the collector is formed on the surface of the transparent conductive film so as to be in partial contact with the semiconductor layer, as mentioned above. Since the adhesive strength between the collector and the semiconductor layer is large as compared with the adhesive strength between the collector and the transparent conductive film, the collector is less prone to be peeled off as compared with the case where a collector is configured so as to be in contact only with a transparent conductive film. It is considered that the adhesive strength between the semiconductor layer and the collector is large since a natural oxidation film formed on the surface of the semiconductor layer has a high affinity for water as compared with the transparent conductive film. As a result, it is considered that the collector can be less prone to be peeled off. Accordingly, peel-off of the collector can be kept in check in modularization of a plurality of photovoltaic devices by connecting them with tabs. Therefore, it is possible to keep reduction of the yield in modularization in check.

In the aforementioned photovoltaic device according to the first aspect, the semiconductor layer preferably includes a first semiconductor layer formed under the transparent conductive film including a non-single-crystalline semiconductor layer, and the collector is in partial contact with the non-single-crystalline semiconductor layer. With this constitution, when the first semiconductor layer includes the crystalline semiconductor layer used as a power generating layer, as compared with the case where a collector is in partial contact with a crystalline semiconductor layer used as a power generating layer, recombination of careers in the boundary between the collector and the first semiconductor layer is less prone to occur in the case where the collector is in partial contact with the non-single-crystalline semiconductor layer. Accordingly, reduction of output characteristic of the photovoltaic device can be kept in check. Therefore, peel-off of the collector can be kept in check, in addition, reduction of output characteristic of the photovoltaic device can be kept in check. The term "non-single-crystalline semiconductor" indicates a wide concept including not only an amorphous semiconductor but also a microcrystalline semiconductor. In this case, the non-single-crystalline semiconductor layer may include an amorphous silicon layer.

In the photovoltaic device having the foregoing semiconductor layer including the first semiconductor layer, the first semiconductor layer preferably includes a first conductivity type crystalline semiconductor layer, a substantially intrinsic first non-single-crystalline semiconductor layer formed on the surface of the crystalline semiconductor layer, and a second conductivity type second non-single-crystalline semiconductor layer formed on the surface of the first non-single-crystalline semiconductor layer, and the collector is in partial contact with the second non-single-crystalline semiconductor layer. With this constitution, in the photovoltaic device where the substantially intrinsic first non-single-crystalline semiconductor layer and the second conductivity type second non-single-crystalline semiconductor layer are successively formed on the surface of the first conductivity type crystalline semiconductor layer, peel-off of the collector can be kept in check. The collector is in partial contact with the second non-single-crystalline semiconductor layer, thus, as compared with the case where a collector is in partial contact with a crystalline semiconductor layer used as a power generating layer, recombination of careers in the boundary between the collector and the first semiconductor layer is less prone to occur in the case where the collector is in partial contact with the second non-single-crystalline semiconductor layer. Accordingly, reduction of output characteristic of the photovoltaic device can be kept in check. In this case, the crystalline semiconductor layer may include a single-crystalline silicon layer, and the first non-single-crystalline semiconductor layer and the second non-single-crystalline semiconductor layer include amorphous silicon layers.

In the photovoltaic device having the foregoing semiconductor layer including the first semiconductor layer, the collector preferably includes first electrode portions for collecting currents, and a second electrode portion for aggregating the currents collected by the first electrode portions, and the second electrode portion is in partial contact with the first semiconductor layer. With this construction, even if an external force tends to be applied to the second electrode portion through a tab when the tab is attached to the second electrode portion, peel-off of the second electrode portion can be kept in check. Accordingly, peel-off of the collector from the photovoltaic device can be kept in check.

In this case, a part of the second electrode portion in the vicinity of its end in the longitudinal direction thereof is preferably in contact with the first semiconductor layer. With this constitution, it is possible to improve the adhesive strength of the part of the second electrode portion in the vicinity of its end which often becomes the starting point of peel-off. Therefore, peel-off of the collector from the photovoltaic device can be easily kept in check.

In the foregoing constitution where the part of the second electrode portion in the vicinity of its end in the longitudinal direction thereof is in contact with the semiconductor layer, parts of the second electrode portion in the vicinities of both its ends in the longitudinal direction thereof are preferably in contact with the first semiconductor layer. With this constitution, it is possible to improve the adhesive strength of the parts of the second electrode portion in the vicinities of both its ends. Therefore, peel-off of the collector from the photovoltaic device can be further kept in check.

In the photovoltaic device having the foregoing semiconductor layer including the first semiconductor layer, preferably, the transparent conductive film includes an opening, which is recessed in a plan view, on a part of the outer side surface of the transparent conductive film, and the collector is in contact with the first semiconductor layer through the opening of the transparent conductive film. With this constitution, even when, due to a small region in the vicinity of the periphery of the first semiconductor layer which is not covered with the transparent conductive film, it is difficult for the collector to be in contact with the region which is not covered with the transparent conductive film, it is possible for the collector to be easily in contact with the first semiconductor layer through the opening of the transparent conductive film.

In this case, at least a part of the opening is preferably formed in a region shaded by the collector. With this constitution, at least a part of the opening can be formed in a region which does not contribute to aggregation of currents in the transparent conductive film. Accordingly, reduction of a region, which contributes to aggregation of currents in the transparent conductive film, for the purpose of contacting the collector with the first semiconductor layer can be kept in check. Therefore, reduction of aggregation efficiency of currents can be kept in check. As a result, it is possible to keep reduction of output characteristic of the photovoltaic device in check.

In the photovoltaic device having the foregoing semiconductor layer including the first semiconductor layer, the transparent conductive film preferably includes a groove, and a part of the collector is in contact with the first semiconductor layer exposed in the groove along the groove of the transparent conductive film. With this constitution, even when, due to a small region in the vicinity of the periphery of the first semiconductor layer which is not covered with the transparent conductive film, it is difficult for the collector to be in contact with the region which is not covered with the transparent conductive film, it is possible for the collector to be easily in contact with the first semiconductor layer through the groove of the transparent conductive film.

In this case, at least a part of the groove is preferably formed in a region shaded by the collector. With this constitution, at least a part of the groove can be formed in a region which does not contribute to aggregation of currents in the transparent conductive film. Accordingly, reduction of a region, which contributes to aggregation of currents in the transparent conductive film, for the purpose of contacting the collector with the first semiconductor layer can be kept in check. Therefore, reduction of aggregation efficiency of currents can be kept in check. As a result, it is possible to keep reduction of output characteristic of the photovoltaic device in check.

In the aforementioned photovoltaic device according to the first aspect, the semiconductor layer preferably includes a first conductivity type crystalline semiconductor layer, a substantially intrinsic first non-single-crystalline semiconductor layer formed on the surface of the crystalline semiconductor layer, and a second conductivity type second non-single-crystalline semiconductor layer formed on the surface of the first non-single-crystalline semiconductor layer, wherein the collector is in partial contact with the crystalline semiconductor layer. With this construction, the collector can be less prone to be peeled off as compared with the case where a collector is in contact only with a part of a transparent conductive film.

In the aforementioned photovoltaic device according to the first aspect, the semiconductor layer preferably includes a second semiconductor layer formed on the transparent conductive film, and the collector is formed so as to be in contact with the second semiconductor layer. With this construction, the collector can be easily less prone to be peeled off by the second semiconductor layer as compared with the case where a collector is configured so as to be in contact only with a transparent conductive film. In this case, the second semiconductor layer may include a silicon layer.

In the constitution where the foregoing semiconductor layer includes the second semiconductor layer, impurities achieving a prescribed conductivity type are preferably added to the second semiconductor layer. With this constitution, since the resistance of the second semiconductor layer can be small, even when the collector is configured so as to be in contact with the second semiconductor layer formed on the transparent conductive film, it is possible to keep large reduction of output characteristic due to the resistance of the second semiconductor in check.

In this case, the second semiconductor layer and the transparent conductive film preferably have the same conductivity type. With this constitution, since the contact resistance between the second semiconductor layer and the transparent conductive film can be reduced, it is possible to further keep reduction of output characteristic in check.

In the constitution where the foregoing semiconductor layer includes the second semiconductor layer, preferably, the collector includes first electrode portions for collecting currents, and a second electrode portion for aggregating the currents collected by the first electrode portions, and the second electrode portion is formed so as to be in contact with the second semiconductor layer. With this construction, even if an external force tends to be applied to the second electrode portion through a tab when the tab is attached to the second electrode portion, peel-off of the second electrode portion can be kept in check. Accordingly, peel-off of the collector from the photovoltaic device can be kept in check.

In this case, the second electrode portion is preferably formed so as to be in contact with the surface of the second semiconductor layer over substantially the whole length of the second semiconductor layer in the longitudinal direction. With this constitution, since the contact area of the second electrode portion in contact with the second semiconductor layer can be increased, peel-off of the second electrode portion can be further kept in check.

In the constitution where the foregoing collector includes the second electrode portion, the second electrode portion is preferably formed so as to be in contact with the second semiconductor layer and additionally with the transparent conductive film. With this constitution, dissimilarly to the case where the second electrode portion is formed so as to be in contact only with the second semiconductor layer, since currents can be directly aggregated from the transparent conductive film to the second electrode portion, it is possible to improve the aggregation efficiency of currents by the collector. As compared with the case where the second electrode portion is formed so as to be in contact only with the second semiconductor layer, according to the adhesive force due to contact of the second electrode portion with the transparent conductive film, since the adhesive force of the second electrode portion can be increased, the peel-off of the second electrode portion can be further kept in check.

In this case, preferably, the second electrode portion is formed so as to be in contact with the upper surface of the transparent conductive film and to cover the upper and side surfaces of the second semiconductor layer. With this constitution, since the contact area of the second electrode portion in contact with the second semiconductor layer can be increased, peel-off of the second electrode portion can be further kept in check.

In the constitution where the foregoing semiconductor layer includes the second semiconductor layer, preferably, the device further comprises a first conductivity type crystalline semiconductor layer, a substantially intrinsic first non-single-crystalline semiconductor layer formed on the surface of the crystalline semiconductor layer, and a second conductivity type second non-single-crystalline semiconductor layer formed on the surface of the first non-single-crystalline semiconductor layer, wherein the transparent conductive film is formed on the surface of the second non-single-crystalline semiconductor layer. With this constitution, in the photovoltaic device where the substantially intrinsic first non-single-crystalline semiconductor layer and the second conductivity type second non-single-crystalline semiconductor layer are successively formed on the surface of the first conductivity type crystalline semiconductor layer, peel-off of the collector can be kept in check. In this case, the crystalline semiconductor layer may include a single-crystalline silicon layer, and the first non-single-crystalline semiconductor layer and the second non-single-crystalline semiconductor layer include amorphous silicon layers.

A photovoltaic device according to a second aspect of the invention comprises a semiconductor layer, a transparent conductive film formed on the surface of the semiconductor layer, and a collector which is formed on the surface of the transparent conductive film so as to be in partial contact with the semiconductor layer.

In the photovoltaic device according to the second aspect, the collector is formed on the surface of the transparent conductive film so as to be in partial contact with the semiconductor layer, as mentioned above. Since the adhesive strength between the collector and the semiconductor layer is large as compared with the adhesive strength between the collector and the transparent conductive film, the collector is less prone to be peeled off as compared with the case where a collector is configured so as to be in contact only with a transparent conductive film. That is, it is considered that the adhesive strength between the semiconductor layer and the collector is large since a natural oxidation film formed on the surface of the semiconductor layer has a high affinity for water as compared with the transparent conductive film. As a result, it is considered that the collector can be less prone to be peeled off. Accordingly, peel-off of the collector can be kept in check in modularization of a plurality of photovoltaic devices by connecting them with tabs. Therefore, it is possible to keep reduction of the yield in modularization of the photovoltaic devices in check.

DESCRIPTION OF THE PREFERRED EMBODIMENTS

Concrete embodiments of the present invention are now described with reference to the drawings.

First Embodiment

Figure 1:
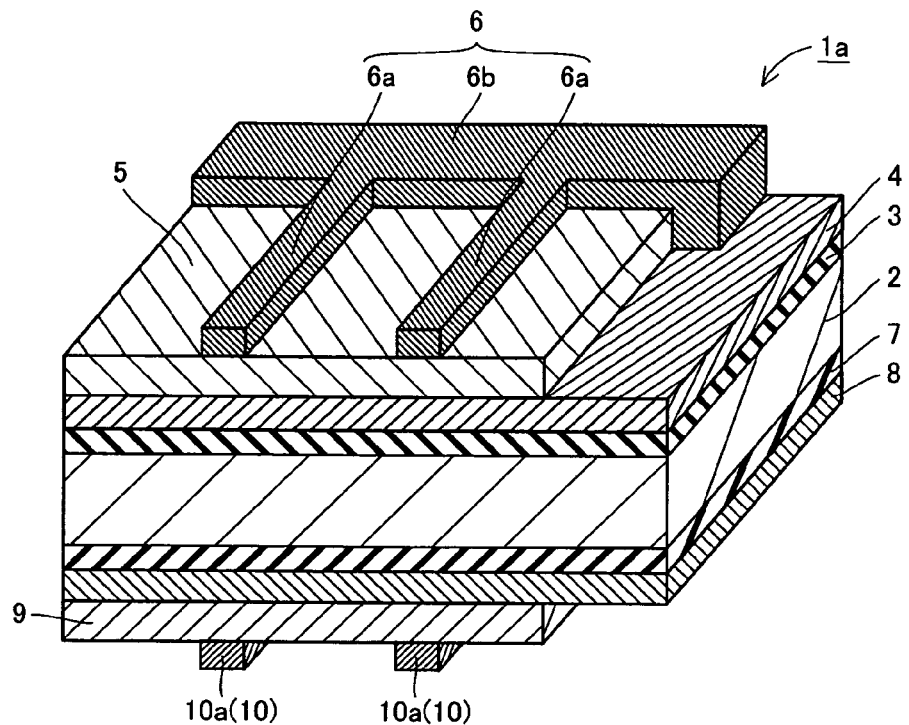
FIG. 1 is an enlarged perspective view partially showing the constitution of a photovoltaic device according to a first embodiment of the present invention.

The structure of a photovoltaic device according to a first embodiment is described with reference to FIGS. 1 to 4. FIG. 1 shows the structure of a region 1a surrounded by a dashed line in FIG. 2.

In the photovoltaic device 1 according to the first embodiment, as shown in FIG. 1, a substantially intrinsic i-type amorphous silicon layer 3 with a thickness of about 5 nm is formed on the upper surface of an n-type single-crystalline silicon substrate 2 which has a resistivity of about 1 Ω·cm, a thickness of about 300 μm and a (100) facet. This n-type single-crystalline silicon substrate 2 is an example of a "semiconductor layer", a "first semiconductor layer", and a "crystalline semiconductor layer" in the present invention. The i-type amorphous silicon layer 3 is an example of the "semiconductor layer", the "first semiconductor layer", and a "first non-single-crystalline semiconductor layer" in the present invention. The n-type single-crystalline silicon substrate 2 serves as a power generating layer. A p-type amorphous silicon layer 4 with a thickness of about 5 nm is formed on the i-type amorphous silicon layer 3. This p-type amorphous silicon layer 4 is an example of the "semiconductor layer", the "first semiconductor layer", and a "second non-single-crystalline semiconductor layer" in the present invention.

Figure 2:
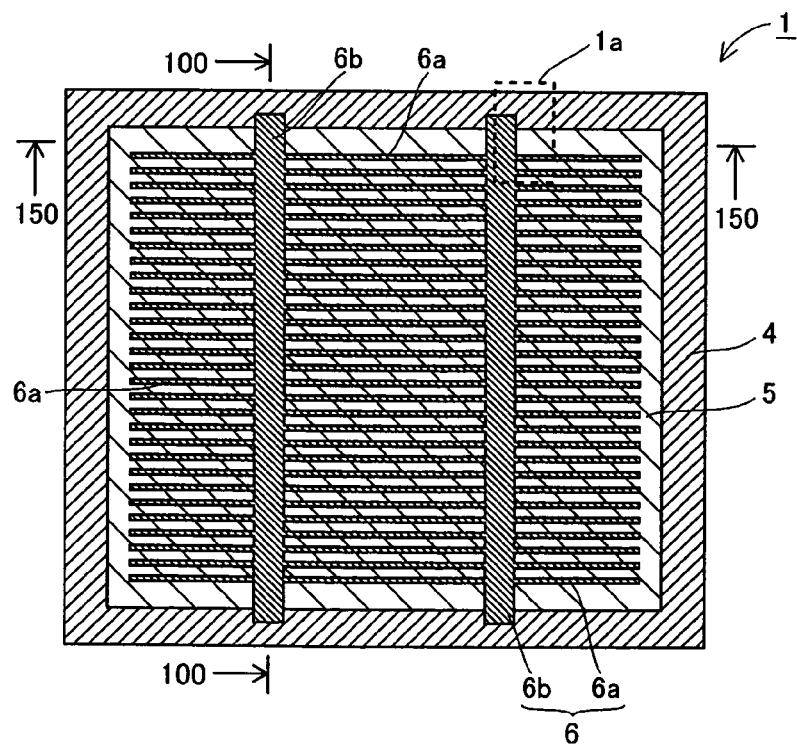
FIG. 2 is a plan view showing the whole constitution of the photovoltaic device according to the first embodiment shown in FIG. 1.

A transparent conductive film 5 with a thickness of about 80 nm to about 100 nm is formed on the p-type amorphous silicon layer 4. As shown in FIG. 2, this transparent conductive film 5 is formed slightly smaller than the p-type amorphous silicon layer 4 as viewed in a plan view. That is, a region, which is not covered with the transparent conductive film 5, is provided in the vicinity of the periphery on the upper surface of the p-type amorphous silicon layer 4. The transparent conductive film 5 is composed of an ITO (Indium Tin Oxide) film which consists of $InO_2$ containing $SnO_2$ of about 5% by weight. A topside collector 6 consisting of silver (Ag) is formed on a prescribed region of the upper surface of the transparent conductive film 5. This topside collector 6 is an example of a "collector" in the present invention. The collector 6 is composed of a plurality of comb-shaped electrode portions 6a formed so as to extend in parallel to each other and be spaced from each other at a prescribed interval, and a bus bar electrode portion 6b aggregating currents flowing in the comb-shaped electrode portions 6a, as shown in FIGS. 1 and 2. This comb-shaped electrode portion 6a is an example of a "first electrode portion" in the present invention. The bus bar electrode portion 6b is an example of a "second electrode portion" in the present invention. The comb-shaped electrode portion 6a has a thickness of about 10 μm to about 50 μm, and a width of about 100 μm to about 500 μm. The bus bar electrode portion 6b has a thickness of about 10 μm to about 100 μm, and a width of about 1.3 mm to about 3 mm.

Figure 3:
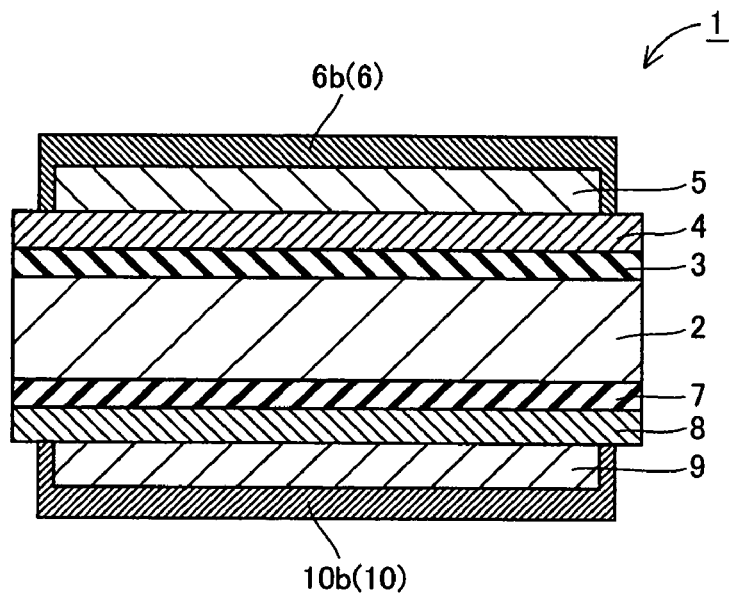
FIG. 3 is a cross-sectional view of the photovoltaic device according to the first embodiment taken along the line 100-100 shown in FIG. 2.

In the first embodiment, parts of the bus bar electrode portion 6b in the vicinities of both its ends in the longitudinal direction thereof are in contact with a region on the upper surface in the vicinity of the periphery of the p-type amorphous silicon layer 4 which is not covered with the transparent conductive film 5 as shown in FIGS. 1 and 3. Since a natural oxidation film whose affinity for water is higher than the transparent conductive film 5 is formed in the region on the upper surface in the vicinity of the periphery of the p-type amorphous silicon layer 4 which is not covered with the transparent conductive film 5, it is considered that the adhesive strength of the part of the bus bar electrode portion 6b in the vicinity of its end, which is in contact with this region, is larger than the adhesive strength of the case of the part, which is in contact with the transparent conductive film 5.

Figure 4:
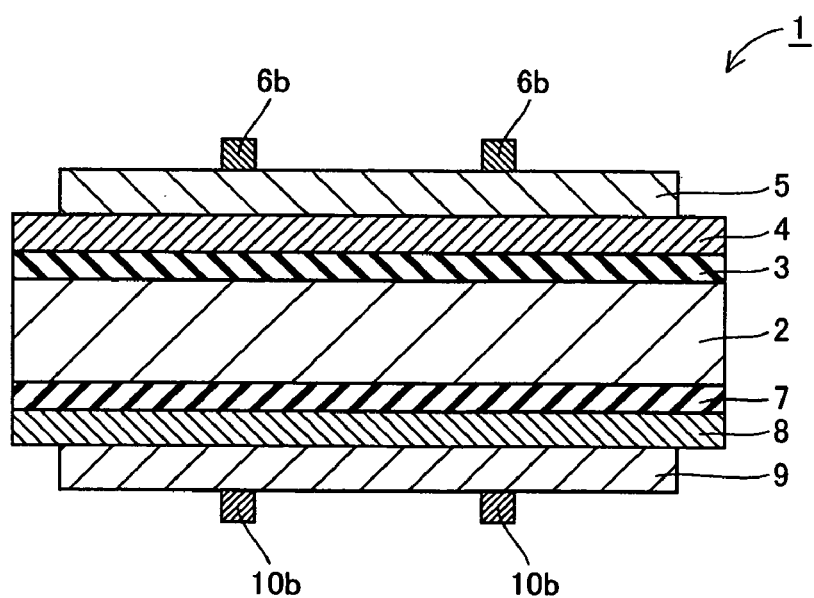
FIG. 4 is a cross-sectional view of the photovoltaic device according to the first embodiment taken along the line 150-150 shown in FIG. 2.

A substantially intrinsic i-type amorphous silicon layer 7 with a thickness of about 5 nm and an n-type amorphous silicon layer 8 with a thickness of about 5 nm are successively formed on the lower surface of the n-type single-crystalline silicon substrate 2. This i-type amorphous silicon layer 7 and the n-type amorphous silicon layer 8 are examples of the "semiconductor layer", and the "first semiconductor layer" in the present invention. A transparent conductive film 9, which has a thickness of about 80 nm to about 100 nm and consists of an ITO film, is formed on lower surface of the n-type amorphous silicon layer 8. A backside collector 10, which is composed of a plurality of comb-shaped electrode portions 10a formed so as to extend in parallel to each other and be spaced from each other at a prescribed interval, and a bus bar electrode portion 10b aggregating currents flowing in the comb-shaped electrode portions 10a, is formed on the lower surface of the transparent conductive film 9, as shown in FIGS. 1 and 4. The comb-shaped electrode portion 10a and the bus bar electrode portion 10b are examples of the "first electrode portion", and the "second electrode portion" in a present invention, respectively. The backside collector 10 is an example of the "collector" in the present invention.

In the first embodiment, parts of the bus bar electrode portion 10b of the backside collector 10 in the vicinities of both its ends in the longitudinal direction thereof are in contact with a region on the lower surface in the vicinity of the periphery of the n-type amorphous silicon layer 8 which is not covered with the transparent conductive film 9 as shown in FIG. 3. Since a natural oxidation film whose affinity for water is higher than the transparent conductive film 9 is formed in the region on the lower surface in the vicinity of the periphery of the n-type amorphous silicon layer 8 which is not covered with the transparent conductive film 9, it is considered that the adhesive strength of the part of the bus bar electrode portion 10b in the vicinity of its end, which is in contact with this region, is larger than the adhesive strength of the case of the part, which is in contact with the transparent conductive film 9. The constitutions of the i-type amorphous silicon layer 7, the n-type amorphous silicon layer 8, the transparent conductive film 9, and the backside collector 10 other than the above constitutions are constitutions similar to the i-type amorphous silicon layer 3, the p-type amorphous silicon layer 4, the transparent conductive film 5, and the topside collector 6 as mentioned above, respectively.

In the first embodiment, with the constitution where the parts of the bus bar electrode portion 6b of the topside collector 6 in the vicinities of both its ends in the longitudinal direction thereof are in contact with the p-type amorphous silicon layer 4, since the adhesive strength between the topside collector 6 and the p-type amorphous silicon layer 4 is large as compared with the adhesive strength between the topside collector 6 and the transparent conductive film 5, the topside collector 6 can be less prone to be peeled off as compared with the case where the topside collector 6 is configured so as to be in contact only with the transparent conductive film 5. That is, it is considered that the adhesive strength between the p-type amorphous silicon layer 4 and the topside collector 6 is large since a natural oxidation film formed on the surface of p-type amorphous silicon layer 4 has a high affinity for water as compared with the transparent conductive film 5. As a result, it is considered that the topside collector 6 can be less prone to be peeled off. Since the parts of the bus bar electrode portion 10b of the backside collector 10 in the vicinities of both its ends in the longitudinal direction thereof are configured so as to be in contact with the n-type amorphous silicon layer 8, the backside collector 10 can be less prone to be peeled off, similarly to the case of the foregoing topside collector 6. Accordingly, peel-off of the topside and backside collectors 6 and 10 can be kept in check in modularization of a plurality of photovoltaic devices 1 by connecting them with tabs. Therefore, it is possible to keep reduction of the yield in modularization of the photovoltaic devices 1 in check.

In the first embodiment, the part of bus bar electrode portion 6b of the topside collector 6 in the vicinity of its end is in contact with the p-type amorphous silicon layer 4, thus, as compared with the case where the topside collector 6 is in contact with the n-type single-crystalline silicon substrate 2 used as a power generating layer, recombination of careers in the boundary between the topside collector 6 and the semiconductor layer is less prone to occur in the case where the topside collector 6 is in contact with the p-type amorphous silicon layer 4. Accordingly, reduction of output characteristic of the photovoltaic device 1 can be kept in check.

In the first embodiment, each part of the bus bar electrode portions 6b and 10b of the topside and backside collectors 6 and 10 in the vicinities of both their ends in the longitudinal direction thereof is in contact with the p-type amorphous silicon layer 4 and the n-type amorphous silicon layer 8, thus, it is possible to improve the adhesive strength of the parts of the bus bar electrode portions 6b and 10b in the vicinities of both their ends in the longitudinal direction thereof which often become the starting points of peel-off. Therefore, peel-off of the topside and backside collectors 6 and 10 can be easily kept in check.

A manufacturing process of the photovoltaic device according to the first embodiment is described with reference to FIGS. 1 to 5.

First, impurities are removed by washing the n-type single-crystalline silicon substrate 2 (see FIG. 1) which has a resistivity of about 1 Ω·cm, a thickness of about 300 μm and a (100) facet. The i-type amorphous silicon layer 3 and the p-type amorphous silicon layer 4, which have a thickness of about 5 nm respectively, are successively deposited on the n-type single-crystalline silicon substrate 2 by using a RF plasma CVD process under conditions of a frequency of about 13.56 MHz, a formation temperature of about 100° C. to about 300° C., a reaction pressure of about 5 Pa to about 100 Pa, and RF power of about 1 mW/cm² to about 500 mW/cm². Thus, a p-i-n junction is formed. A group III element such as B, Al, Ga, and In can be used as a p-type dopant in formation of the p-type amorphous silicon layer 4. The p-type amorphous silicon layer 4 can be formed by mixing compound gas containing at least one of the above p-type dopants into material gas such as $SiH_4$ (silane) gas in formation of the p-type amorphous silicon layer 4.

Subsequently, as shown in FIGS. 3 and 4, the i-type amorphous silicon layer 7 with a thickness of about 5 nm and the n-type amorphous silicon layer 8 with a thickness of about 5 nm are formed on the lower surface of the n-type single-crystalline silicon substrate 2 in this order. A group V element such as P, N, As, and Sb can be used as an n-type dopant in formation of the n-type amorphous silicon layer 8. The n-type amorphous silicon layer 8 can be formed by mixing compound gas containing at least one of the above n-type dopants into the material gas in formation of the n-type amorphous silicon layer 8. Formation processes of the n-type amorphous silicon layers 8 and the i-type amorphous silicon layer 7 other than these processes are similar to the aforementioned formation processes of the p-type amorphous silicon layer 4 and the i-type amorphous silicon layer 3, respectively.

After that, the transparent conductive films 5 and 9 consisting of ITO films are formed on the p-type amorphous silicon layer 4 and the n-type amorphous silicon layer 8 by sputtering, respectively. In this case, the transparent conductive films 5 and 9 are formed in regions which are slightly smaller than formation regions of the p-type amorphous silicon layer 4 and the n-type amorphous silicon layer 8, respectively. In the formation of the transparent conductive films 5 and 9, a target consisting of a sintered body of $In_2O_3$ powder containing about 5% by weight of $SnO_2$ powder is set on a cathode (not shown) in a chamber (not shown) of a sputtering apparatus (not shown). The Sn content in the ITO film can be varied by changing the quantity of the $SnO_2$ powder. The content of Sn with respect to In is preferably about 1% by weight to about 10% by weight. The sintering density of the target is preferably at least about 90%. In the formation of the transparent conductive films 5 and 9, a sputtering apparatus capable of applying a strong magnetic field of about 1000 Gauss with a magnet is used.

Figure 5:
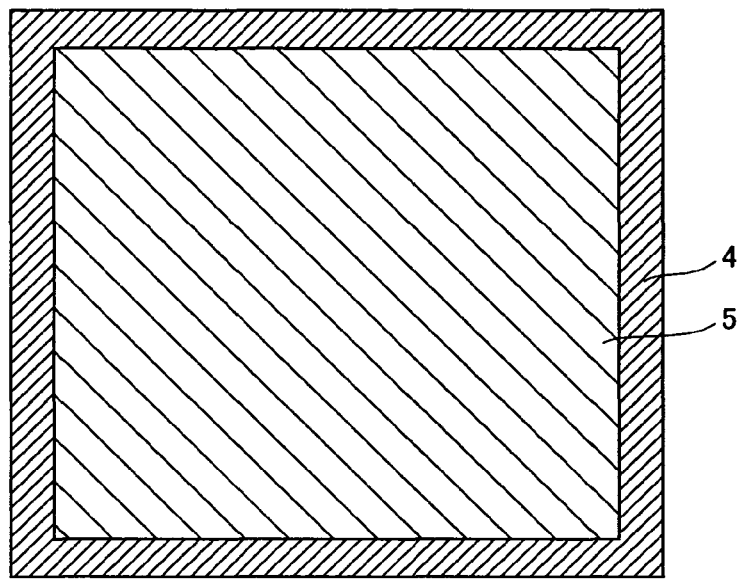
FIG. 5 is a plan view for illustrating a manufacturing process of the photovoltaic device according to the first embodiment of the present invention.

After prescribed regions on the surfaces in the vicinity of the peripheries of the p-type amorphous silicon layer 4 and the n-type amorphous silicon layer 8 are covered with metal masks, the n-type single-crystalline silicon substrate 2, which has the p-type amorphous silicon layer 4 and the n-type amorphous silicon layer 8 formed thereon, is arranged so as to be opposed to and in parallel to the cathode. After the chamber (not shown) is evacuated, a heater (not shown) heats the chamber until the substrate temperature reaches about 200° C. In the state that the substrate temperature is held about 200° C., mixed gas of Ar and $O_2$ is fed for holding the pressure to about 0.4 Pa to about 1.3 Pa, and DC power of about 0.5 kw to about 2 kW is applied to the cathode for starting discharge. In this case, a film forming rate is about 10 nm/min. to about 80 nm/min. while the n-type single-crystalline silicon substrate 2 is stood still with respect to the cathode. Thus, as shown in FIGS. 3 to 5, the transparent conductive films 5 and 9 are formed in the regions, which are slightly smaller than the formation regions of the p-type amorphous silicon layer 4 and the n-type amorphous silicon layer 8, so as to have a thickness of about 80 nm to about 100 nm, respectively.

Subsequently, the topside collector 6 is formed by applying Ag paste prepared by kneading impalpable silver powder (Ag) powder into epoxy resin to the prescribed region of the upper surface of the transparent conductive film 5 by screen printing. In this formation, the topside collector 6 is formed so that the comb-shaped electrode portion 6*a* has a thickness of about 10 μm to about 50 μm, and a width of about 100 μm to about 500 μm, and the bus bar electrode portion 6*b* has a thickness of about 10 μm to about 100 μm, and a width of about 1.3 mm to about 3 mm.

In the first embodiment, the bus bar electrode portion 6*b* is formed so that the parts of the bus bar electrode portion 6*b* in the vicinities of both its ends in the longitudinal direction thereof are in contact with the region on the upper surface in the vicinity of the periphery of the p-type amorphous silicon layer 4 which is not covered with the transparent conductive film 5. After that, the Ag paste is hardened by firing it for about 80 minutes at about 200° C. Thus, the topside collector 6, which is composed of the plurality of comb-shaped electrode portions 6*a* formed so as to extend in parallel to each other and be spaced from each other at the prescribed interval and the bus bar electrode portion 6*b* aggregating currents flowing in the comb-shaped electrode portions 6*a*, is formed as shown in FIG. 2.

Finally, the backside collector 10, which is composed of the plurality of comb-shaped electrode portions 10*a* formed so as to extend in parallel to each other and be separated from each other at the prescribed interval and the bus bar electrode portion 10*b* aggregating currents flowing in the comb-shaped electrode portions 10*a*, is formed on the lower surface of the transparent conductive film 9 by screen printing. This backside collector 10 is formed similarly to the topside collector 6 as mentioned above. Consequently, the photovoltaic device 1 according to this embodiment shown in FIG. 1 is formed.

Second Embodiment

The structure of a photovoltaic device according to a second embodiment is described with reference to FIGS. 6 to 8.

Figure 6:
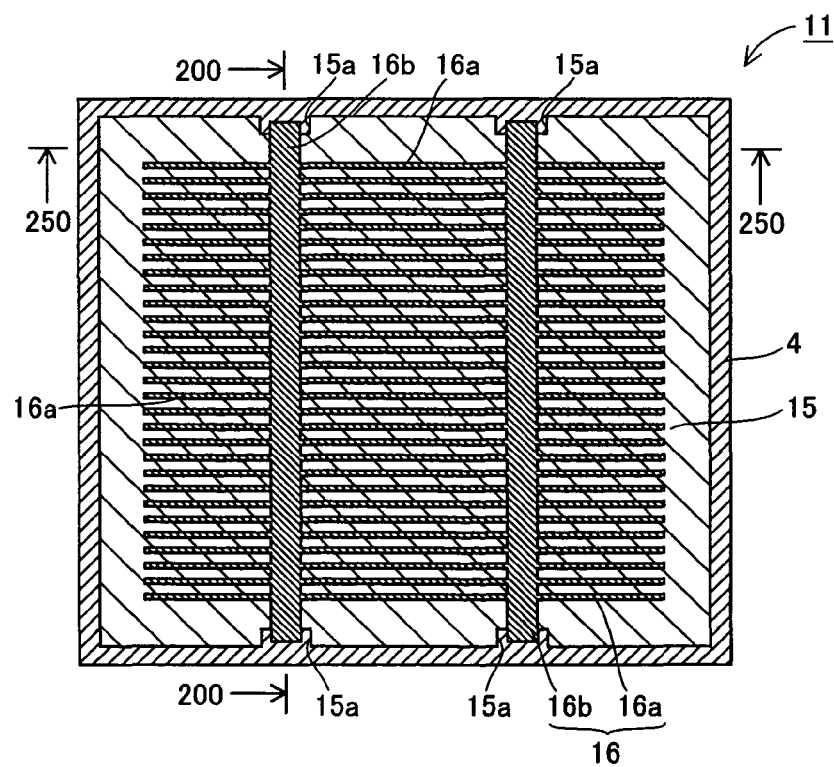
FIG. 6 is a plan view showing the whole constitution of a-photovoltaic device according to a second embodiment.
Figure 7:
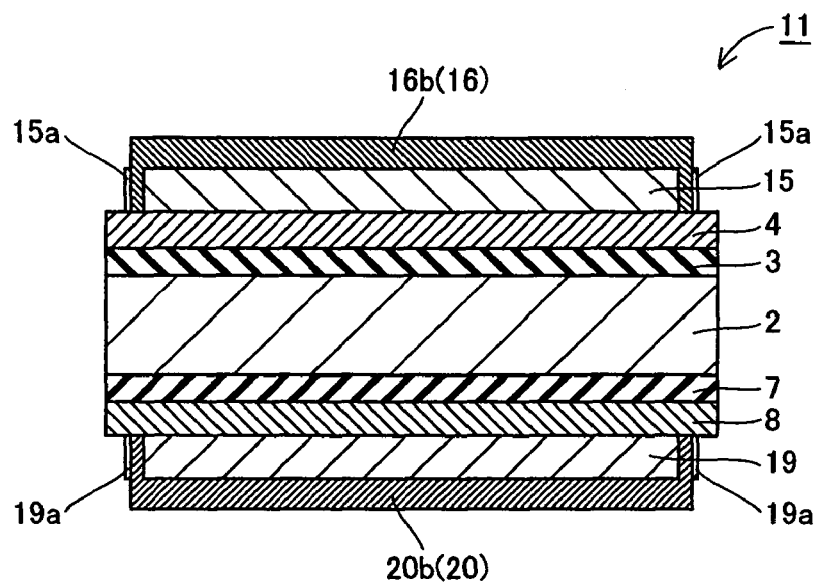
FIG. 7 is a cross-sectional view of the photovoltaic device according to the second embodiment taken along the line 200-200 shown in FIG. 6.

In a photovoltaic device 11 according to the second embodiment, as shown in FIGS. 6 and 7, dissimilarly to the photovoltaic device 1 (see FIG. 1) according to the foregoing first embodiment, parts of respective bus bar electrode portions 16*b* and 20*b* of topside and backside collectors 16 and 20 in the vicinities of both their ends in the longitudinal direction thereof are in contact with the p-type amorphous silicon layer 4 and the n-type amorphous silicon layer 8, respectively, through openings 15*a* and 19*a*, which are formed on the outer side surfaces of transparent conductive films 15 and 19 and are recessed in a plan view. Since natural oxidation films whose affinity for water is higher than the transparent conductive films 15 and 19 are formed on the surfaces of the respective p-type amorphous silicon layer 4 and n-type amorphous silicon layer 8 which are exposed in the openings 15*a* and 19*a*, it is considered that the adhesive strengths of the parts of the bus bar electrode portions 16*b* and 20*b* in the vicinities of their ends, which are in contact with the these surfaces, are larger than the adhesive strengths of the case of the parts, which are in contact with the transparent conductive films 15 and 19, respectively.

The openings 15*a* and 19*a* of the transparent conductive films 15 and 19 are formed in regions shaded by the bus bar electrode portions 16*b* and 20*b* and tabs (not shown) attached onto the bus bar electrode portions 16*b* and 20*b*. As shown in FIGS. 6 to 8, in the second embodiment, the areas of the regions, which are not covered with the transparent conductive films 15 and 19 on the upper surfaces in the vicinities of the peripheries of the p-type amorphous silicon layer 4 and the n-type amorphous silicon layer 8, are configured to be small as compared with the photovoltaic device 1 (see FIGS. 2 to 4) according to the foregoing first embodiment. In other words, the photovoltaic device 11 according to the second embodiment is configured so that a region, which contributes to aggregation of currents in the transparent conductive films 15 and 19, is large as compared with the photovoltaic device 1 according to the foregoing first embodiment. Therefore, in the photovoltaic device 11 according to the second embodiment, it is possible to improve aggregation efficiency of currents as compared with the photovoltaic device 1 according to the foregoing first embodiment. The structure of the photovoltaic device according to the second embodiment other than the above structure is similar to the structure of the photovoltaic device according to the foregoing first embodiment.

A manufacturing process of the photovoltaic device according to the second embodiment is described with reference to FIGS. 6 to 9.

Figure 8:
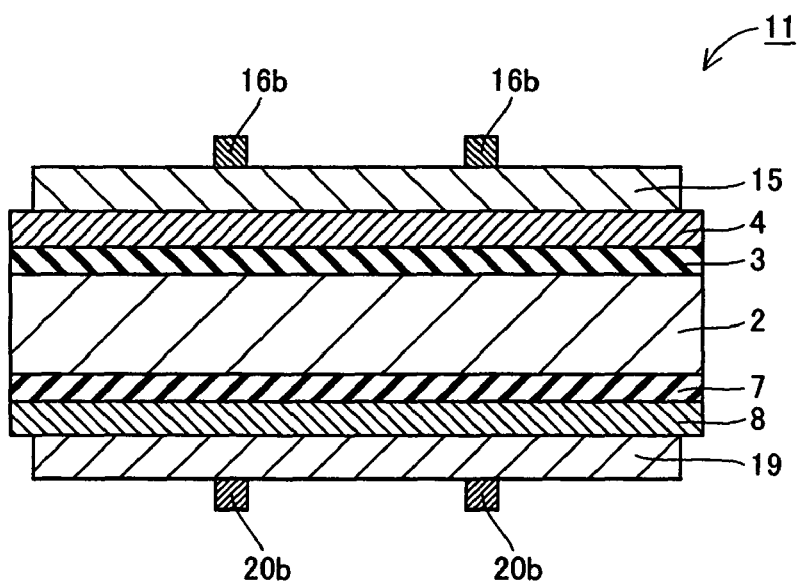
FIG. 8 is a cross-sectional view of the photovoltaic device according to the second embodiment taken along the line 250-250 shown in FIG. 6.

First, as shown in FIGS. 7 and 8, after the i-type amorphous silicon layer 3 and the p-type amorphous silicon layer 4 are successively laminated on the upper surface of the n-type single-crystalline silicon substrate 2, the i-type amorphous silicon layer 7 and the n-type amorphous silicon layer 8 are successively laminated on the lower surface of the n-type single-crystalline silicon substrate 2.

Figure 9:
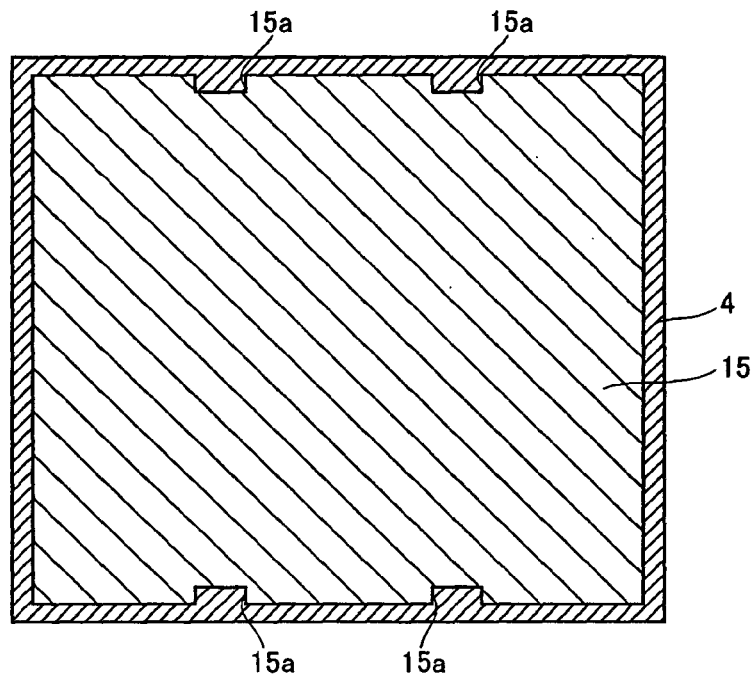
FIG. 9 is a plan view for illustrating a manufacturing process of the photovoltaic device according to the second embodiment of the present invention.

Subsequently, in the second embodiment, as shown in FIGS. 7 to 9, the transparent conductive films 15 and 19 having the openings 15*a* and 19*a*, which are recessed in a plan view, on their outer side surfaces are formed on the surfaces of the p-type amorphous silicon layer 4 and the n-type amorphous silicon layer 8 by using metal masks, respectively.

After that, as shown in FIGS. 6 to 8, the topside collector 16 composed of the comb-shaped electrode portions 16*a* and the bus bar electrode portion 16*b* is formed in a prescribed region on the upper surface of the transparent conductive film 15, and then the backside collector 20 composed of the comb-shaped electrode portions (not shown) and the bus bar electrode portion 20*b* is formed in a prescribed region on the lower surface of the transparent conductive film 19 by screen printing.

In this case, in the second embodiment, the bus bar electrode portion 16*b* is formed so that the parts of the bus bar electrode portion 16*b* in the vicinities of both its ends in the longitudinal direction thereof are in contact with the p-type amorphous silicon layer 4 through the openings 15*a* of the transparent conductive film 15, while the bus bar electrode portion 20*b* is formed so that the parts of the bus bar electrode portion 20*b* in the vicinities of both its ends in the longitudinal direction thereof are in contact with the n-type amorphous silicon layer 8 through the openings 19*a* of the transparent conductive film 19. The manufacturing process of the photovoltaic device 11 according to the second embodiment other than the above manufacturing process is similar to the manufacturing process of the photovoltaic device 1 according to the foregoing first embodiment.

In the second embodiment, the parts of the bus bar electrode portion 16b of the topside collector 16 in the vicinities of both its ends in the longitudinal direction thereof are in contact with the p-type amorphous silicon layer 4 through the openings 15a of the transparent conductive film 15 as mentioned above, thus, even when, due to a small area of the region in the vicinity of the periphery on the upper surface of the p-type amorphous silicon layer 4 which is not covered with the transparent conductive film 15, it is difficult for the topside collector 16 to be in contact with the region which is not covered with the transparent conductive film 15, it is possible for the topside collector 16 to be easily in contact with the p-type amorphous silicon layer 4 through the openings 15a.

In the second embodiment, the opening 15a is formed in the region of the transparent conductive film 15 shaded by the bus bar electrode portion 16b and the tab attached to the bus bar electrode portion 16b, thus, the opening 15a can be formed in the region which does not contribute to aggregation of currents in the transparent conductive film 15. Accordingly, it is not necessary to reduce the region, which contributes to aggregation of currents in the transparent conductive film 15, for the purpose of contacting the topside collector 16 with the p-type amorphous silicon layer 4. Therefore, reduction of aggregation efficiency of currents can be kept in check. As a result, it is possible to keep reduction of output characteristic of the photovoltaic device in check.

The effects of the second embodiment other than the above effects are similar to the effects of the foregoing first embodiment.

Third Embodiment

The structure of a photovoltaic device according to a third embodiment is described with reference to FIGS. 10 to 12.

Figure 10:
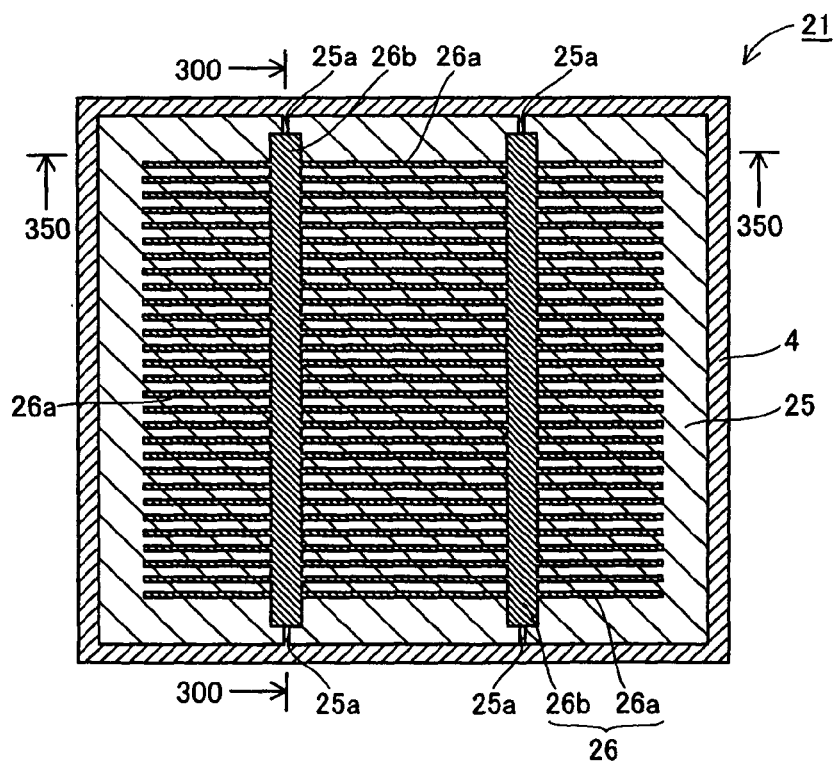
FIG. 10 is a plan view showing the whole constitution of a photovoltaic device according to a third embodiment.
Figure 11:
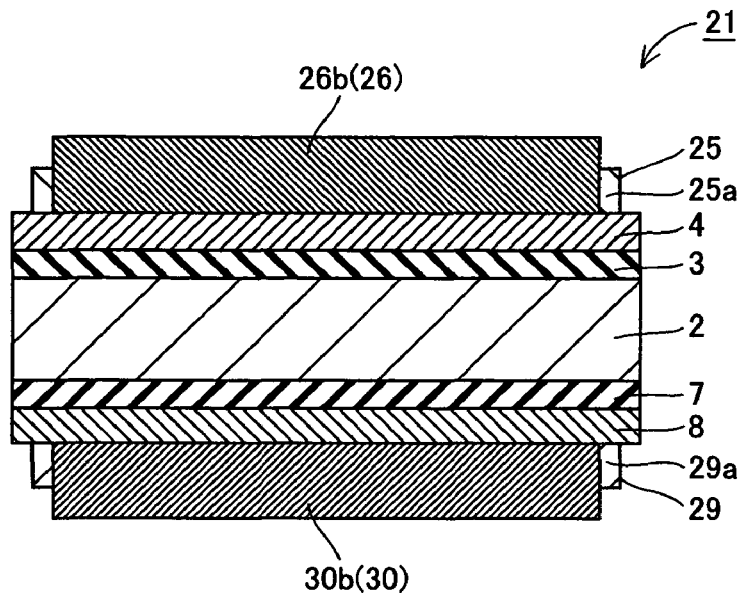
FIG. 11 is a cross-sectional view of the photovoltaic device according to the third embodiment taken along the line 300-300 shown in FIG. 10.
Figure 12:
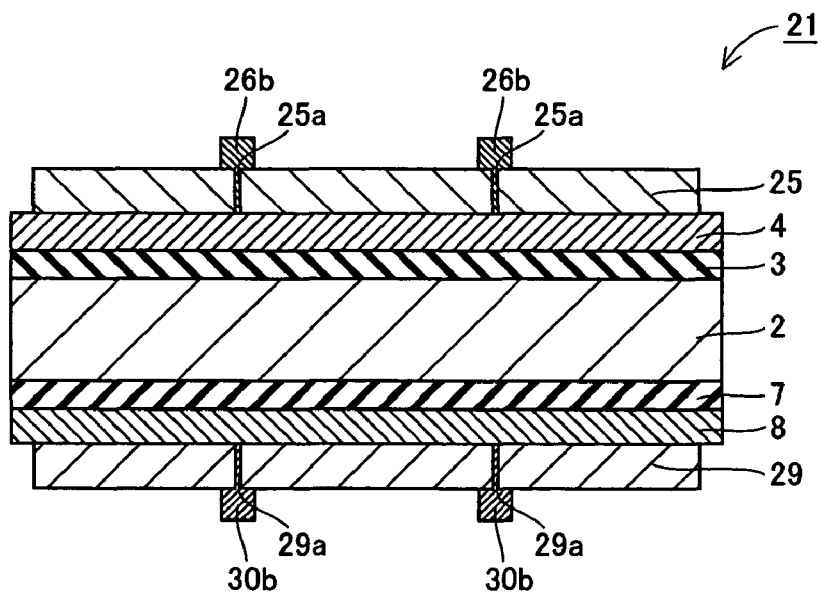
FIG. 12 is a cross-sectional view of the photovoltaic device according to the third embodiment taken along the line 350-350 shown in FIG. 10.

In a photovoltaic device 21 according to the third embodiment, as shown in FIGS. 10 to 12, dissimilarly to the photovoltaic device 1 (see FIG. 1) according to the foregoing first embodiment, two linear grooves 25a and 29a are formed so as to extend along the longitudinal direction of bus bar electrode portions 26b and 30b in the transparent conductive films 25 and 29, respectively. The bus bar electrode portions 26b and 30b of the topside collector 26 and the backside collector 30 are in partial contact with the p-type amorphous silicon layer 4 and the n-type amorphous silicon layer 8 along the grooves 25a and 29a, respectively. Since natural oxidation films whose affinity for water is higher than the transparent conductive films 25 and 29 are formed on the surfaces of the respective p-type amorphous silicon layer 4 and n-type amorphous silicon layer 8 which are exposed in the grooves 25a and 29a, it is considered that the adhesive strengths of parts of the bus bar electrode portions 26b and 30b, which are in contact with these surfaces, are larger than the adhesive strengths of case of the parts, which are in contact with the transparent conductive films 25 and 29, respectively.

The grooves 25a and 29a of the transparent conductive films 25 and 29 are formed in regions shaded by the bus bar electrode portions 26b and 30b, and tabs (not shown) attached to the bus bar electrode portions 26b and 30b. As shown in FIGS. 10 to 12, the photovoltaic device according to the third embodiment is configured so that the areas of the regions which are not covered with the transparent conductive films 25 and 29 on the upper surfaces in the vicinities of the peripheries of the p-type amorphous silicon layer 4 and the n-type amorphous silicon layer 8 is small as compared with the photovoltaic device 1 (see FIGS. 2 to 4) according to the foregoing first embodiment. In other words, the photovoltaic device 21 according to the third embodiment is configured so that regions, which contribute to aggregation of currents in the transparent conductive films 25 and 29, are large as compared with the photovoltaic device 1 according to the foregoing first embodiment. Therefore, in the photovoltaic device 21 according to the third embodiment, it is possible to improve aggregation efficiency of currents as compared with the photovoltaic device 1 according to the foregoing first embodiment. The structure of the photovoltaic device 21 according to the third embodiment other than the above structure is similar to the structure of the photovoltaic device 1 according to the foregoing first embodiment.

A manufacturing process of the photovoltaic device according to the third embodiment is described with reference to FIGS. 10 to 13.

First, as shown in FIGS. 11 and 12, after the i-type amorphous silicon layer 3 and the p-type amorphous silicon layer 4 are successively laminated on the upper surface of the n-type single-crystalline silicon substrate 2, the i-type amorphous silicon layer 7 and the n-type amorphous silicon layer 8 are successively laminated on the lower surface of the n-type single-crystalline silicon substrate 2. Subsequently, as shown in FIGS. 11 to 13, the transparent conductive films 25 and 29 are formed in regions, which are slightly smaller than the formation regions of the p-type amorphous silicon layer 4 and the n-type amorphous silicon layer 8, on the surfaces of the p-type amorphous silicon layer 4 and the n-type amorphous silicon layer 8 by using metal masks, respectively.

Figure 13:
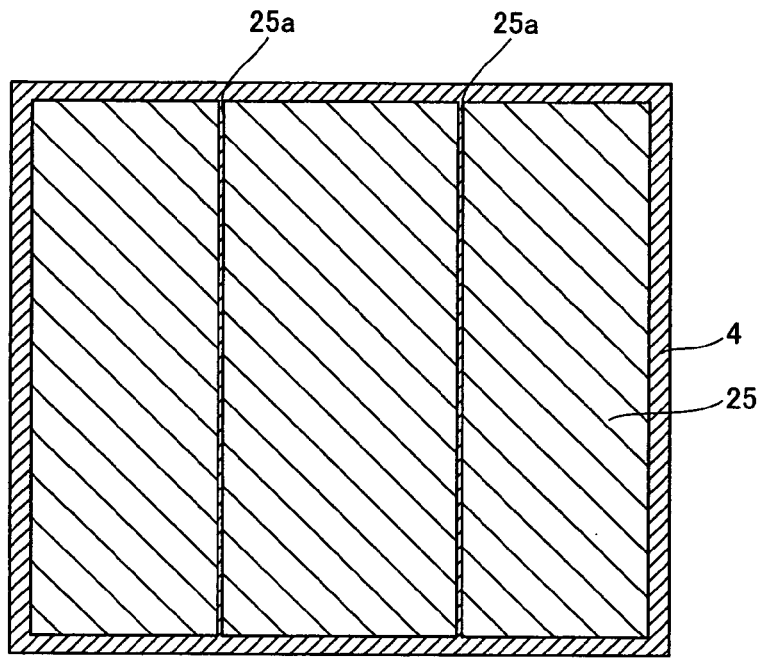
FIG. 13 is a plan view for illustrating a manufacturing process of the photovoltaic device according to the third embodiment of the present invention.

Next, in the third embodiment, as shown in FIGS. 12 and 13, the two pairs of linear grooves 25a and 29a are formed by removing parts of the transparent conductive films 25 and 29 by using an excimer laser, respectively.

After that, the topside collector 26 composed of the comb-shaped electrode portions 26a and the bus bar electrode portion 26b is formed in a prescribed region on the upper surface of the transparent conductive film 25, and then the backside collector 30 composed of the comb-shaped electrode portions (not shown) and the bus bar electrode portion 30b is formed in a prescribed region on the lower surface of the transparent conductive film 29 by screen printing. In this case, the bus bar electrode portion 26b is formed so as to extend along each of two grooves 25a of the transparent conductive film 25, while the bus bar electrode portion 30b is formed so as to extend along each of two grooves 29a of the transparent conductive film 29. Thus, the bus bar electrode portions 26b and 30b are in contact with the p-type amorphous silicon layer 4 and the n-type amorphous silicon layer 8 which are exposed in the grooves 25a and 29a, along the grooves 25a and 29a of the transparent conductive films 25 and 29, respectively. The manufacturing process of the photovoltaic device 21 according to the third embodiment other than the above manufacturing process is similar to the manufacturing process of the photovoltaic device 1 according to the foregoing first embodiment.

In the third embodiment, the bus bar electrode portion 26b of the topside collector 26 is in partial contact with the p-type amorphous silicon layer 4 along the groove 25a of the transparent conductive film 25 as mentioned above, thus, even when, due to a small area of the region in the vicinity of the periphery on the upper surface of the p-type amorphous silicon layer 4 which is not covered with the transparent conductive film 25, it is difficult for the topside collector 26 to be in contact with the region which is not covered with the transparent conductive film 25, it is possible for the topside collector 26 to be easily in contact with the p-type amorphous silicon layer 4 through the groove 25a.

In the third embodiment, the groove 25a is formed in the region of the transparent conductive film 25 shaded by the bus bar electrode portion 26b and the tab attached to the bus bar electrode portion 26b, thus, the groove 25a can be formed in the region which does not contribute to aggregation of currents in the transparent conductive film 25. Accordingly, it is not necessary to reduce the region, which contributes to aggregation of currents in the transparent conductive film 25, for the purpose of contacting the topside collector 26 with the p-type amorphous silicon layer 4. Therefore, reduction of aggregation efficiency of currents can be kept in check. As a result, it is possible to keep reduction of output characteristic of the photovoltaic device in check.

The effects of the third embodiment other than the above effects are similar to the effects of the foregoing first embodiment.

Fourth Embodiment

Figure 14:
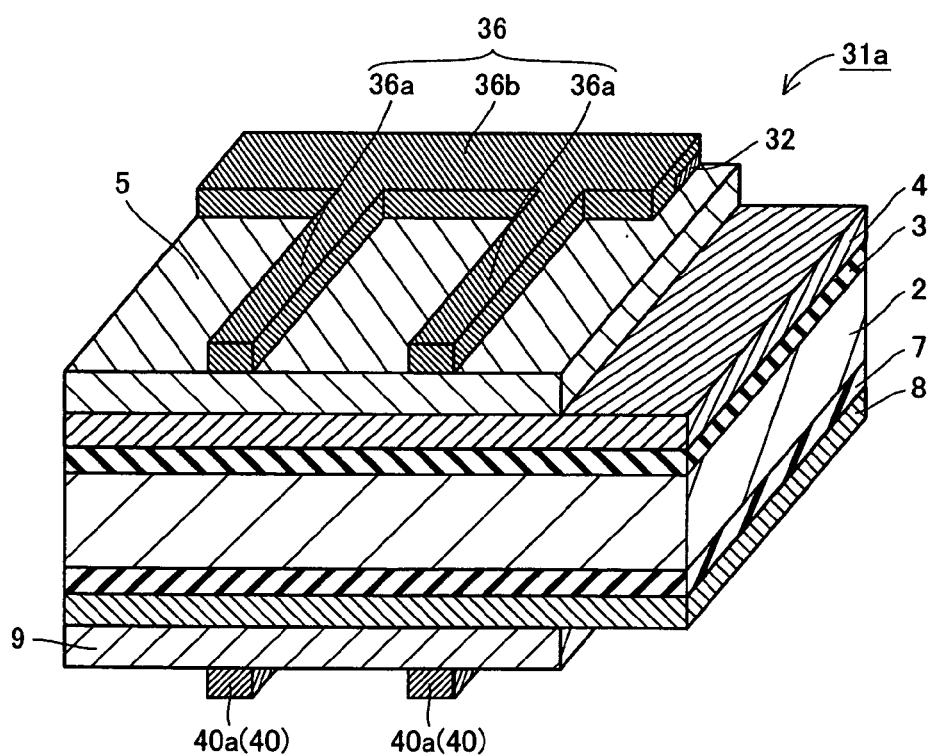
FIG. 14 is an enlarged perspective view partially showing the constitution of a photovoltaic device according to a fourth embodiment of the present invention.

The structure of a photovoltaic device according to a fourth embodiment is described with reference to FIGS. 14 to 18. FIG. 14 shows the structure of a region 31a surrounded by a dashed line in FIG. 15.

Figure 16:
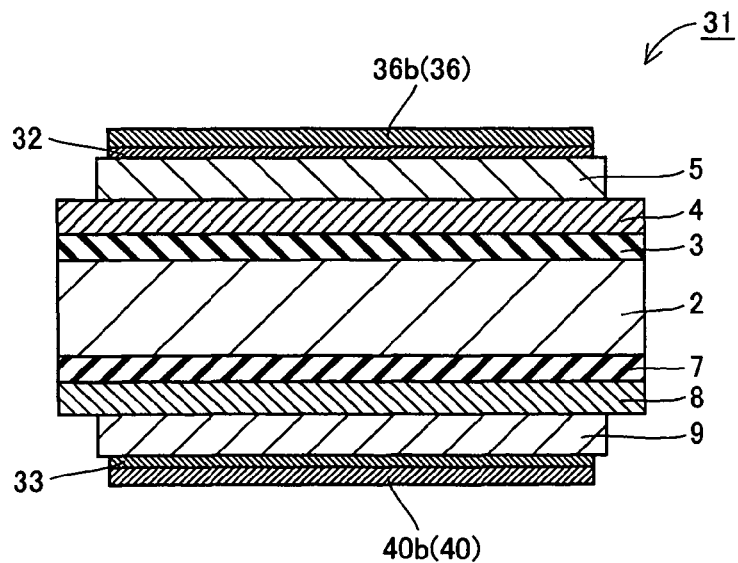
FIG. 16 is a cross-sectional view of the photovoltaic device according to the fourth embodiment taken along the line 400-400 shown in FIG. 15.
Figure 17:
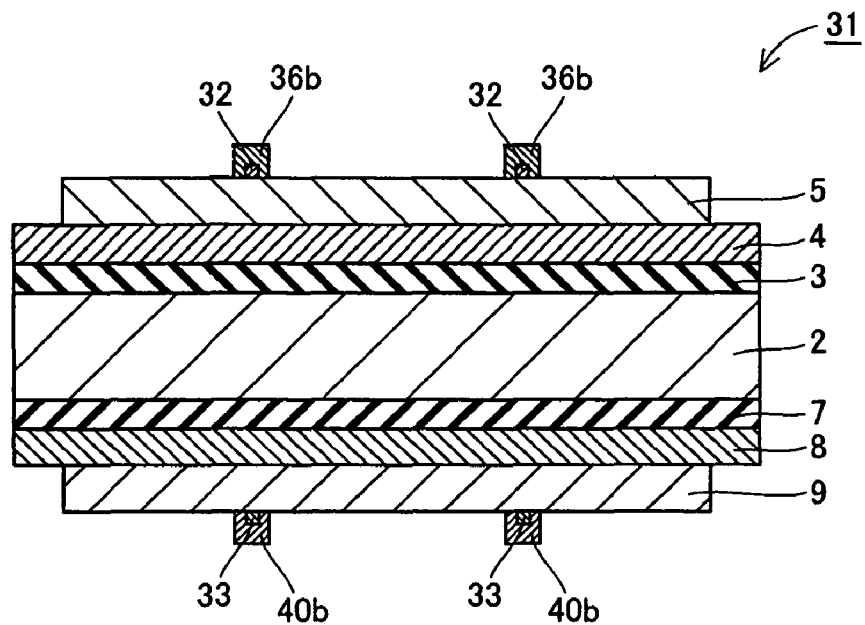
FIG. 17 is a cross-sectional view of the photovoltaic device according to the fourth embodiment taken along the line 450-450 shown in FIG. 15.
Figure 18:
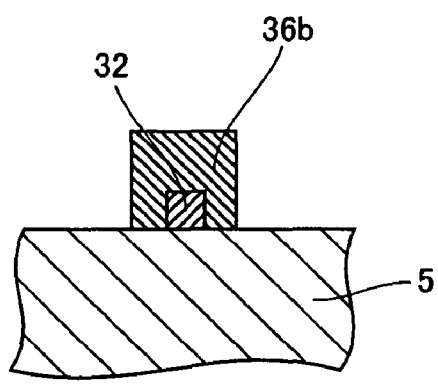
FIG. 18 is an enlarged cross-sectional view showing the constitution of a bus bar electrode portion of the photovoltaic device according to the fourth embodiment shown in FIG. 17.

In a photovoltaic device 31 according to the fourth embodiment, as shown in FIGS. 14 and 16 to 18, dissimilarly to the photovoltaic device 1 (see FIG. 1) according to the foregoing first embodiment, two amorphous silicon layers 32 are formed in prescribed regions on the transparent conductive film 5 so as to be spaced from each other at a prescribed interval. This amorphous silicon layer 32 is an example of the "semiconductor layer", and a "second semiconductor layer" in the present invention. The amorphous silicon layer 32 is formed to be a substantially intrinsic i-type semiconductor with a width of about 0.5 mm and a thickness of about 1.5 nm. The bus bar electrode portion 36b of the topside collector 36 is formed on each of the two amorphous silicon layers 32. This bus bar electrode portion 36b is formed so as to be in contact with the surfaces of the amorphous silicon layer 32 over the whole its length in the longitudinal direction as shown in FIG. 16. As shown in FIG. 18, the bus bar electrode portion 36b is formed so as to cover the upper and side surfaces of the amorphous silicon layer 32, and is formed so as to be in contact with regions of the both sides of the region, where the amorphous silicon layer 32 is formed, of the upper surface of the transparent conductive film 5. That is, the bus bar electrode portion 36b has a width (about 1.5 mm) and thickness (about 40 μm) larger than the amorphous silicon layer 32, and is formed so as to cover the amorphous silicon layer 32. The amorphous silicon layers 33 which have a structure similar to the above amorphous silicon layer 32 are formed on the lower surface of the transparent conductive film 9 on the lower surface side of the photovoltaic device 31, as shown in FIGS. 16 and 17. The bus bar electrode portion 40b, which has a structure similar to the above bus bar electrode portion 36b, is formed so as to be in contact with the surfaces of the amorphous silicon layer 33 over the whole its length in the longitudinal direction. The bus bar electrode portion 40b is formed so as to cover the lower and side surfaces of the amorphous silicon layer 33, and is formed so as to be in contact with regions of the both sides of the region, where the amorphous silicon layer 33 is formed, of the lower surface of the transparent conductive film 9. That is, the bus bar electrode portion 40b has a width (about 1.5 mm) and thickness (about 40 μm) larger than the amorphous silicon layer 33, and is formed so as to cover the amorphous silicon layer 33.

Since natural oxidation films whose affinity for water is higher than the transparent conductive films 5 and 9 are formed on the surfaces of the amorphous silicon layers 32 and 33, it is considered that the adhesive strengths of the bus bar electrode portions 36b and 40b, which are in contact with the surfaces of these amorphous silicon layers 32 and 33, are larger than the adhesive strengths of the case of the portions, which are in contact with the transparent conductive films 5 and 9, respectively. The structure of the photovoltaic device 31 according to the fourth embodiment other than the above structure is similar to the structure of the photovoltaic device 1 according to the foregoing first embodiment.

A manufacturing process of the photovoltaic device according to the fourth embodiment is described with reference to FIGS. 14 to 18.

Figure 15:
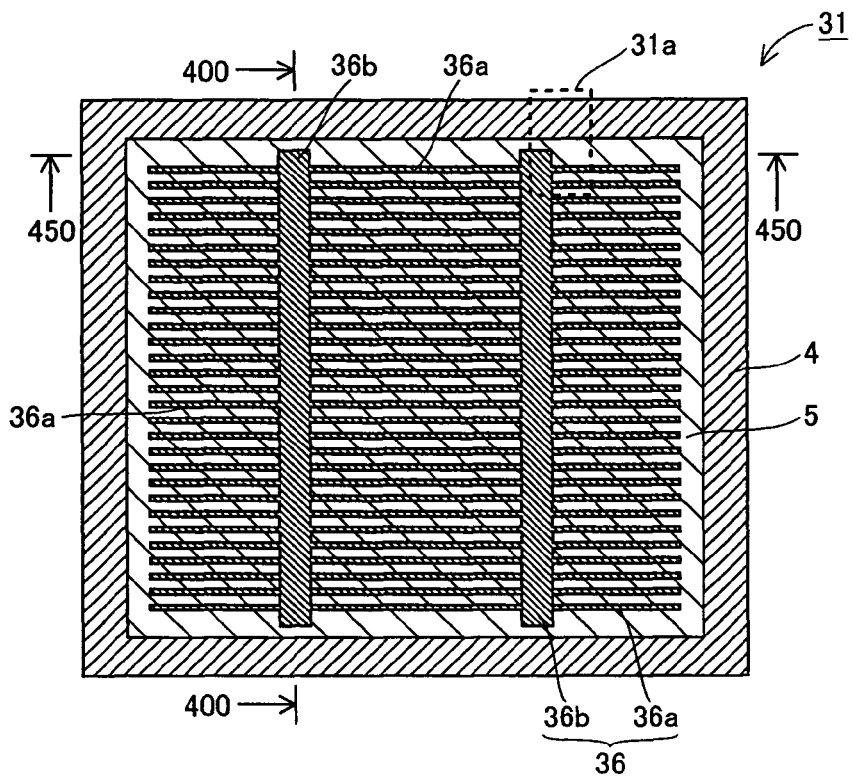
FIG. 15 is a plan view showing the whole constitution of the photovoltaic device according to the fourth embodiment shown in FIG. 14.

In the fourth embodiment, as shown in FIGS. 15 to 17, similarly to the foregoing first embodiment, after the i-type amorphous silicon layer 3 and the p-type amorphous silicon layer 4 are successively laminated on the upper surface of the n-type single-crystalline silicon substrate 2, the i-type amorphous silicon layer 7 and the n-type amorphous silicon layer 8 are successively laminated on the lower surface of the n-type single-crystalline silicon substrate 2. Subsequently, the transparent conductive films 5 and 9 are formed in regions, which are slightly smaller than the formation regions of the p-type amorphous silicon layer 4 and the n-type amorphous silicon layer 8, on the surfaces of the p-type amorphous silicon layer 4 and the n-type amorphous silicon layer 8 by using metal masks, respectively.

Next, in the fourth embodiment, the two amorphous silicon layers 32 are formed in the prescribed regions on the upper surface of the transparent conductive film 5 so as to be spaced from each other at the prescribed interval by using the metal mask or the like. In this case, the amorphous silicon layer 32 is formed to be an i-type semiconductor with a width of about 0.5 mm and a thickness of about 1.5 nm. The two amorphous silicon layers 33 are formed in the prescribed regions on the lower surface of the transparent conductive film 9 so as to be spaced from each other at the prescribed interval similarly to the above amorphous silicon layer 32.

After that, the topside collector 36 composed of the comb-shaped electrode portions 36a and the bus bar electrode portion 36b is formed on the transparent conductive film 5 and the two amorphous silicon layers 32 by screen printing. In this case, the bus bar electrode portion 36b has a width (about 1.5 mm) and thickness (about 40 μm) larger than the amorphous silicon layer 32, and is formed so as to be in contact with the surfaces of the amorphous silicon layer 32 over the whole its length in the longitudinal direction and to cover the upper and side surfaces of the amorphous silicon layer 32. The bus bar electrode portion 36b is formed so as to be also in contact with the regions of the both sides of the region, where the amorphous silicon layer 32 is formed, of the upper surface of the transparent conductive film 5. Subsequently, the backside collector 40 composed of the comb-shaped electrode portions (not shown) and the bus bar electrode portion 40b is formed on the transparent conductive film 9 and the two amorphous silicon layers 33 by screen printing. In this case, the bus bar electrode portion 40b has a width (about 1.5 mm) and thickness (about 40 μm) larger than the amorphous silicon layer 33, and is formed so as to be in contact with the surfaces of the amorphous silicon layer 33 over the whole its length in the longitudinal direction and to cover the lower and side surfaces of the amorphous silicon layer 33. The bus bar electrode portion 40b is formed so as to be also in contact with the regions of the both sides of the region, where the amorphous silicon layer 33 is formed, of the lower surface of the transparent conductive film 9. The manufacturing process of the photovoltaic device 31 according to the fourth embodiment other than the above manufacturing process is similar to the manufacturing process of the photovoltaic device 1 according to the foregoing first embodiment.

In the fourth embodiment, as mentioned above, the bus bar electrode portions 36b and 40b of the topside collector 36 and the backside collector 40 are formed so as to be in contact with the surfaces of the amorphous silicon layers 32 and 33 over the whole their lengths in the longitudinal direction, and to cover the upper and side surfaces of the amorphous silicon layer 32, and the lower and side surfaces of the amorphous silicon layer 33, respectively. Since the adhesive strength between each of the topside collector 36 and the backside collector 40, and each of the amorphous silicon layers 32 and 33 is large as compared with the adhesive strength in the case of between each of the topside collector 36 and the backside collector 40, and each of the transparent conductive films 5 and 9, the topside collector 36 and the backside collector 40 can be less prone to be peeled off as compared with the case where the topside collector 36 and the backside collector 40 are in contact only with the transparent conductive films 5 and 9, respectively. That is, it is considered that adhesive strength between each of the topside collector 36 and the backside collector 40, and each of the amorphous silicon layers 32 and 33 is large since natural oxidation films formed on the surfaces of the amorphous silicon layer 32 and 33 have a high affinity for water as compared with the transparent conductive films 5 and 9. As a result, it is considered that the topside collector 36 and the backside collector 40 can be less prone to be peeled off. Accordingly, peel-off of the topside and backside collectors 36 and 40 can be kept in check in modularization of a plurality of photovoltaic devices 31 by connecting them with tabs. Therefore, it is possible to keep reduction of the yield in modularization of the photovoltaic devices 31 in check.

Fifth Embodiment

The structure of a photovoltaic device according to a fifth embodiment is described with reference to FIGS. 19 to 21.

Figure 19:
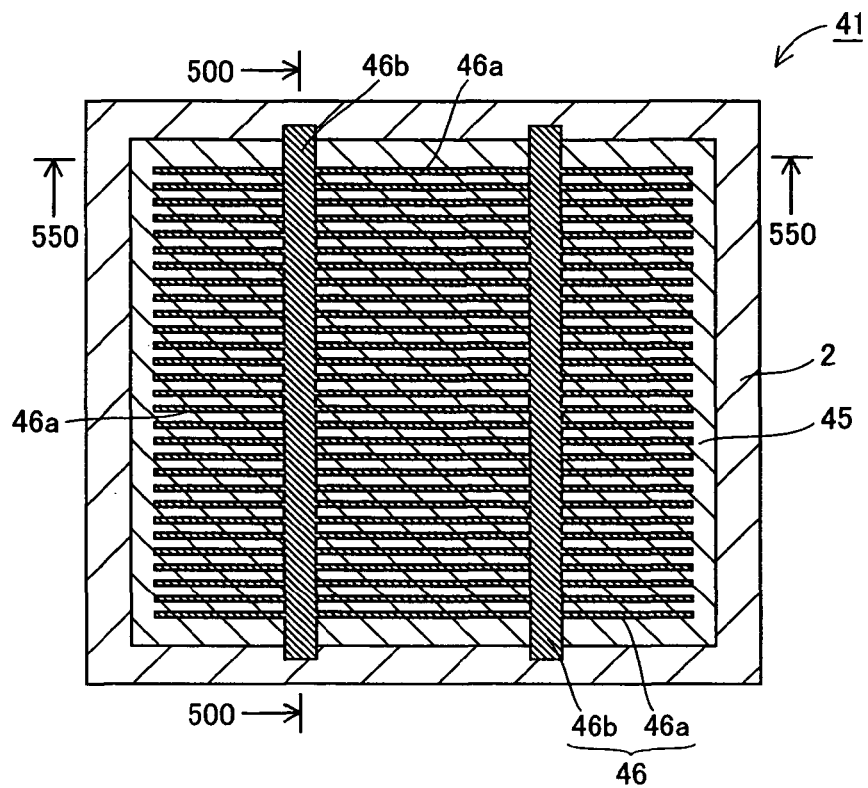
FIG. 19 is a plan view showing the whole constitution of a photovoltaic device according to a fifth embodiment.
Figure 20:
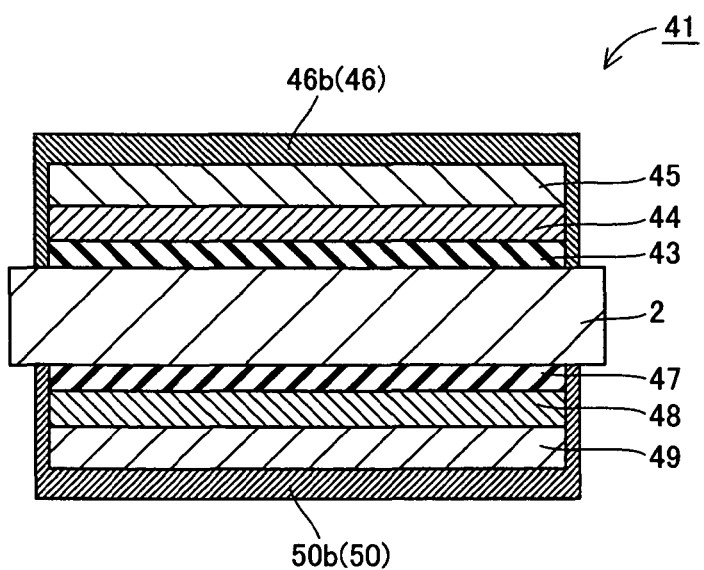
FIG. 20 is a cross-sectional view of the photovoltaic device according to the fifth embodiment taken along the line 500-500 shown in FIG. 19.

In a photovoltaic device 41 according to the fifth embodiment, as shown in FIGS. 19 and 20, dissimilarly to the photovoltaic device 1 (see FIG. 1) according to the foregoing first embodiment, parts of respective bus bar electrode portions 46b and 50b of topside and backside collectors 46 and 50 in the vicinities of both their ends in the longitudinal direction thereof are in contact with the upper and lower surfaces of the n-type single-crystalline silicon substrate 2, respectively. In the fifth embodiment, as shown in FIGS. 20 and 21, all of i-type amorphous silicon layers 43 and 47, p-type amorphous silicon layer 44, n-type amorphous silicon layer 48, and transparent conductive films 45 and 49 are formed in regions which are slightly smaller than the n-type single-crystalline silicon substrate 2. That is, a region, which is not covered with the i-type amorphous silicon layer 43, the p-type amorphous silicon layer 44, and the transparent conductive film 45, is formed on the upper surface in the vicinity of the periphery of the n-type single-crystalline silicon substrate 2, while a region which is not covered with the i-type amorphous silicon layer 47, the n-type amorphous silicon layer 48, and the transparent conductive film 49 is formed on the lower surface in the vicinity of the periphery of the n-type single-crystalline silicon substrate 2. The i-type amorphous silicon layer 43 is an example of the "semiconductor layer", the "first semiconductor layer", and the "first non-single-crystalline semiconductor layer" in the present invention. The p-type amorphous silicon layer 44 is an example of the "semiconductor layer", the "first semiconductor layer", and the "second non-single-crystalline semiconductor layer" in the present invention. The i-type amorphous silicon layer 47 is an example of the "semiconductor layer", and the "first semiconductor layer" in the present invention. The n-type amorphous silicon layer 48 is an example of the "semiconductor layer", and the "first semiconductor layer" in the present invention.

A part of the bus bar electrode portion 46b of the topside collector 46 in the vicinity of its end is in contact with the region, which is not covered with the i-type amorphous silicon layer 43, the p-type amorphous silicon layer 44, and the transparent conductive film 45, of the upper surface of the n-type single-crystalline silicon substrate 2. While, a part of the bus bar electrode portion 50b of the backside collector 50 in the vicinity of its end is in contact with the region, which is not covered with the i-type amorphous silicon layer 47, the n-type amorphous silicon layer 48, and the transparent conductive film 49, of the lower surface of the n-type single-crystalline silicon substrate 2. Since natural oxidation films whose affinity for water is higher than the transparent conductive films 45 and 49 are formed in the regions, which are not covered with the i-type amorphous silicon layers 43 and 47, the p-type amorphous silicon layer 44, the n-type amorphous silicon layer 48, and the transparent conductive films 45 and 49, of the surfaces of the n-type single-crystalline silicon substrate 2, it is considered that the adhesive strengths of the bus bar electrode portions 46b and 50b in the vicinities of their ends, which are in contact with the surfaces of these regions, are larger than the adhesive strengths of the case of the portions, which are in contact with the transparent conductive films 45 and 49. The structure of the photovoltaic device 41 according to the fifth embodiment other than the above structure is similar to the structure of the photovoltaic device 1 according to the foregoing first embodiment.

A manufacturing process of the photovoltaic device according to the fifth embodiment is described with reference to FIGS. 19 to 21.

Figure 21:
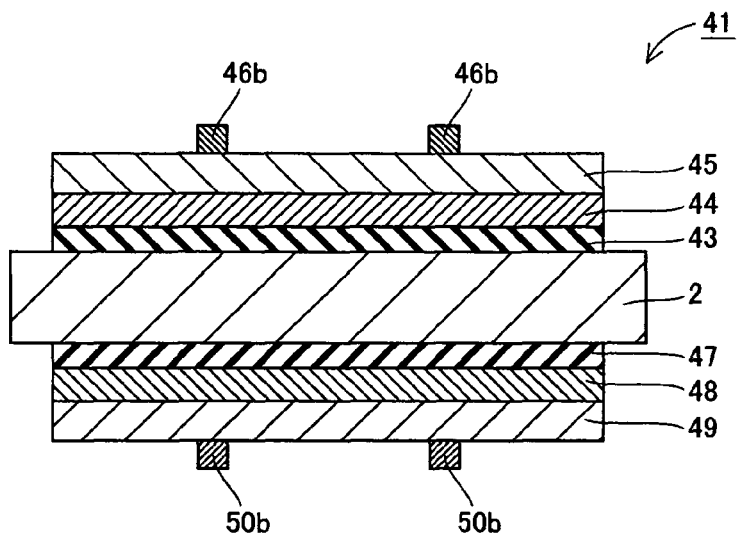
FIG. 21 is a cross-sectional view of the photovoltaic device according to the fifth embodiment taken along the line 550-550 shown in FIG. 19.

In the fifth embodiment, as shown in FIGS. 20 and 21, after the i-type amorphous silicon layer 43 and the p-type amorphous silicon layer 44 are successively laminated in the region, which is slightly smaller than the n-type single-crystalline silicon substrate 2, on the upper surface of the n-type single-crystalline silicon substrate 2, the i-type amorphous silicon layer 47 and the n-type amorphous silicon layer 48 are successively laminated in the region, which is slightly smaller than the n-type single-crystalline silicon substrate 2, on the lower surface of the n-type single-crystalline silicon substrate 2 by using metal masks. After that, the transparent conductive films 45 and 49 are formed on the respective surfaces of the p-type amorphous silicon layer 44 and the n-type amorphous silicon layer 48 by using metal masks, respectively.

Subsequently, as shown in FIGS. 19 to 21, the topside collector 46 composed of the comb-shaped electrode portions 46a and the bus bar electrode portion 46b is formed in a prescribed region on the upper surface of the transparent conductive film 45, and then the backside collector 50 composed of the comb-shaped electrode portions (not shown) and the bus bar electrode portion 50b is formed in a prescribed region on the lower surface of the transparent conductive film 49 by screen printing.

In this case, in the fifth embodiment, the bus bar electrode portion 46b is formed so that the parts of the bus bar electrode portion 46b in the vicinities of both its ends in the longitudinal direction thereof are in contact with the region on the upper surface in the vicinity of the periphery of the n-type single-crystalline silicon substrate 2, while the bus bar electrode portion 50b is formed so that the parts of the bus bar electrode portion 50b in the vicinities of both its ends in the longitudinal direction thereof are in contact with the region on the lower surface in the vicinity of the periphery of the n-type single-crystalline silicon substrate 2. The manufacturing process of the photovoltaic device 41 according to the fifth embodiment other than the above manufacturing process is similar to the manufacturing process of the photovoltaic device 1 according to the foregoing first embodiment.

In the fifth embodiment, as mentioned above, the parts of the bus bar electrode portions 46b and 50b of the topside collector 46 and the backside collector 50 in the vicinities of both their ends in the longitudinal direction thereof are in contact with the upper and lower surfaces of the n-type single-crystalline silicon substrate 2, respectively. Since the adhesive strength between each of the topside collector 46 and the backside collector 50, and the n-type single-crystalline silicon substrate 2 is large as compared with the adhesive strength between each of the topside collector 46 and the backside collector 50, and each of the transparent conductive films 45 and 49, the topside collector 46 and the backside collector 50 can be less prone to be peeled off as compared with the case where the topside collector 46 and the backside collector 50 are in contact only with the transparent conductive films 45 and 49, respectively. That is, it is considered that adhesive strength between the n-type single-crystalline silicon substrate 2 and each of the topside collector 46 and the backside collector 50 is large since natural oxidation films formed on the surfaces of the n-type single-crystalline silicon substrate 2 have a high affinity for water as compared with the transparent conductive films 45 and 49. As a result, it is considered that the topside collector 46 and the backside collector 50 can be less prone to be peeled off. Accordingly, peel-off of the topside and backside collectors 46 and 50 can be kept in check in modularization of a plurality of photovoltaic devices 41 by connecting them with tabs. Therefore, it is possible to keep reduction of the yield in modularization of the photovoltaic devices 41 in check.

An adhesive strength test of the collector for confirming the effects in the foregoing first to fifth embodiments is now described.

Figure 22:
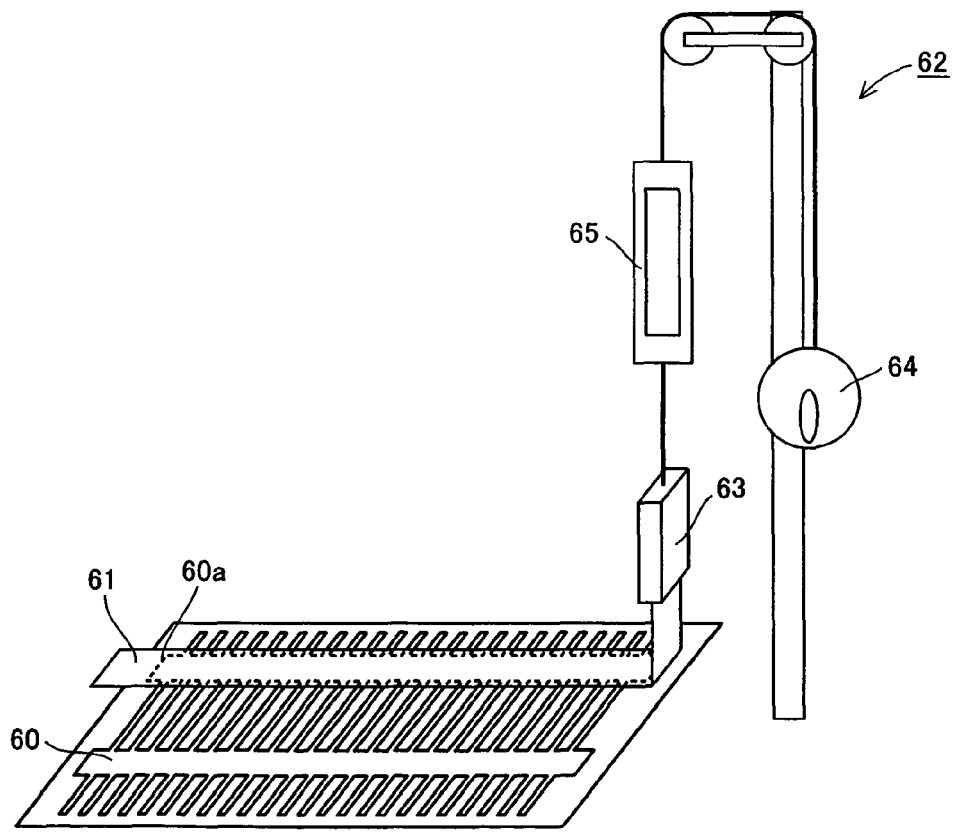
FIG. 22 is a schematic view for illustrating a test method of measuring the adhesive strength of a collector.
Figure 23:
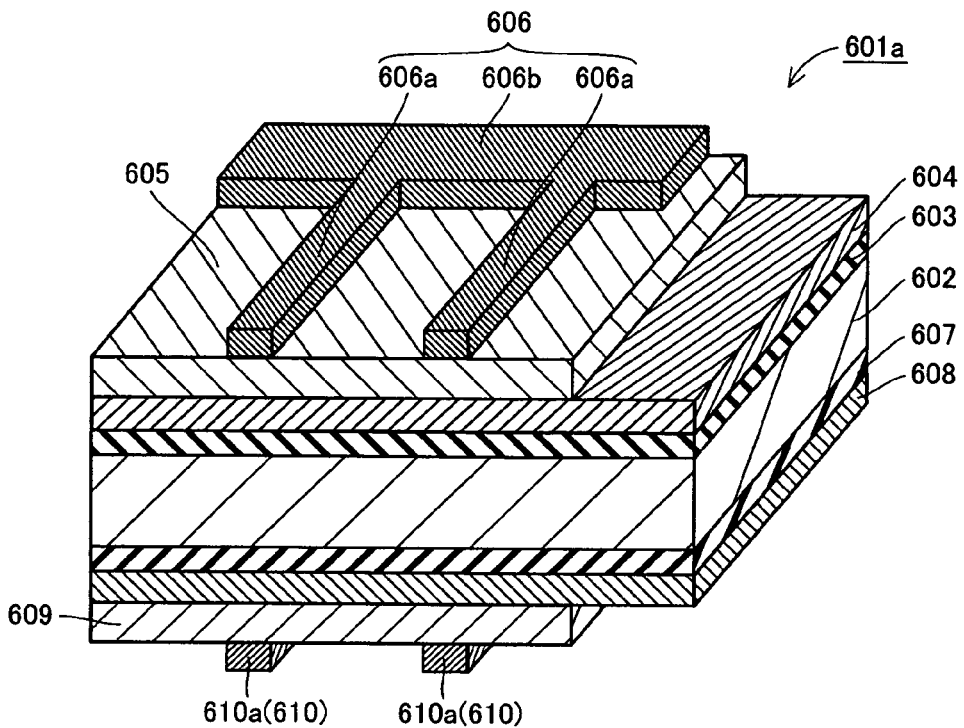
FIG. 23 is an enlarged perspective view partially showing the constitution of an exemplary conventional photovoltaic device.

First, the three samples in which collectors were formed on respective upper surfaces of a n-type single-crystalline silicon substrate, a p-type amorphous silicon layer, and a transparent conductive film were prepared. In each of three samples, the adhesive strength of collector was measured. In the measurement of adhesive strength, as shown in FIG. 22, a tab 61 which has a width of 1.5 mm and a thickness of 150 μm was attached onto a bus bar electrode portion 60a of a collector 60. This tab 61 was an electric wire which consists of Cu foil to be used when a plurality of photovoltaic devices were modularized by connecting them, and was coated with solder. After a flux was applied to the bus bar electrode portion 60a of the collector 60, this tab 61 was attached to the bus bar electrode portion 60a with solder by heating the tab 61. Next, the sample was secured. After one end of the tab 61 in the perpendicular direction with respect to the upper surface of the sample was bent, the bent end was held by a clip 63 of a measurement apparatus 62. Then, the peel strength was measured by means of a measuring instrument 65 when the tab 61 and the collector 60 was peeled off from the sample by rotating a handle 64 of the measurement apparatus 62 to pull the tab 61. The adhesive strength of the collector was measured as mentioned above.

In the measurement of adhesive strength of the collectors according to the three above samples, where the normalized adhesive strength was defined as that the adhesive strength was set to 1 in the sample in which the collector was formed on the upper surface of the transparent conductive film, the normalized adhesive strength was 5.2 to 6.3 in the sample in which the collector was formed on the upper surface of the p-type amorphous silicon layer, and the normalized adhesive strength was 4.9 to 6.0 in the sample in which the collector was formed on the upper surface of the n-type single-crystalline silicon substrate. From this result, it was found that a very large adhesive strength could be obtained in the case where the collector was formed on the p-type amorphous silicon layer or the upper surface of the n-type single-crystalline silicon substrate as compared with the case where the collector was formed on the upper surface of the transparent conductive film. The reason is considered that improvement of wettability of the surface of the p-type amorphous silicon layer or the n-type single-crystalline silicon substrate due to the natural oxidation film with high affinity for water formed on the surface of the p-type amorphous silicon layer or the n-type single-crystalline silicon substrate improves the adhesive strength between the p-type amorphous silicon layer or the n-type single-crystalline silicon substrate, and the collector.

Next, after photovoltaic devices of the following embodiments 1-6 and comparative example 1 were prepared, the adhesive strength of collector in each prepared photovoltaic device was measured.

EXAMPLE 1

A photovoltaic device according to an example 1 was configured similarly to the upper surface side of the photovoltaic device according to the foregoing first embodiment. Specifically, an i-type amorphous silicon layer was formed so as to cover an n-type single-crystalline silicon substrate of a 10 cm square, and a p-type amorphous silicon layer was formed so as to cover the whole upper surface of the i-type amorphous silicon layer. Subsequently, a transparent conductive film of a 9 cm square was formed on the upper surface of the p-type amorphous silicon layer. Thus, a region, which was not covered with the transparent conductive film, with a width of 5 mm was formed on the upper surface in the vicinity of the periphery of the p-type amorphous silicon layer. A collector, which had a bus bar electrode portion longer than the one side of the transparent conductive film, was formed on the upper surface of the transparent conductive film. The collector was configured so that parts of the bus bar electrode portion, which extended 2 mm from the both edges, were in contact with the p-type amorphous silicon layer, respectively. The formed bus bar electrode portion had a width of 1.5 mm, and a thickness of 40 μm.

EXAMPLE 2

A photovoltaic device according to an example 2 was configured similarly to the upper surface side of the photovoltaic device according to the foregoing second embodiment. Specifically, an i-type amorphous silicon layer was formed so as to cover an n-type single-crystalline silicon substrate of a 10 cm square, and a p-type amorphous silicon layer was formed so as to cover the whole upper surface of the i-type amorphous silicon layer. Subsequently, a transparent conductive film having openings, which were recessed in a rectangular shape in a plan view, on the outer side surface thereof was formed on the upper surface of the p-type amorphous silicon layer. In this case, a region, which was not covered with the transparent conductive film, with a width of 5 mm was formed on the upper surface in the vicinity of the periphery of the p-type amorphous silicon layer. A collector was formed on the upper surface of the transparent conductive film. The collector was configured so that parts of the bus bar electrode portion, which extended 2 mm from the both edges, of the collector were in contact with the p-type amorphous silicon layer through the openings of the transparent conductive film, respectively. The formed bus bar electrode portion had a width of 1.5 mm, and a thickness of 40 μm.

EXAMPLE 3

A photovoltaic device according to an example 3 was configured similarly to the upper surface side of the photovoltaic device according to the foregoing third embodiment Specifically, an i-type amorphous silicon layer was formed so as to cover an n-type single-crystalline silicon substrate of a 10 cm square, and a p-type amorphous silicon layer was formed so as to cover the whole upper surface of the i-type amorphous silicon layer. Subsequently, a transparent conductive film of a 9 cm square was formed on the upper surface of the p-type amorphous silicon layer. Thus, a region, which was not covered with the transparent conductive film, with a width of 5 mm was formed on the upper surface in the vicinity of the periphery of the p-type amorphous silicon layer. After that, two linear grooves with a width of 0.5 μm were formed by removing parts of transparent conductive film by using an excimer laser. A collector was formed on the upper surface of the transparent conductive film. The collector was configured so that the bus bar electrode portion of the collector was in contact with the p-type amorphous silicon layer along each of the two grooves. The formed bus bar electrode portion had a width of 1.5 mm, and a thickness of 40 μm.

EXAMPLE 4

A photovoltaic device according to an example 4 was configured similarly to the upper surface side of the photovoltaic device according to the foregoing fourth embodiment. Specifically, an i-type amorphous silicon layer was formed so as to cover an n-type single-crystalline silicon substrate of a 10 cm square, and a p-type amorphous silicon layer was formed so as to cover the whole upper surface of the i-type amorphous silicon layer. Subsequently, a transparent conductive film of a 9 cm square was formed on the upper surface of the p-type amorphous silicon layer. After that, two amorphous silicon layers were formed in prescribed regions on the upper surface of the transparent conductive film so as to be spaced from each other at a prescribed interval. The two formed amorphous silicon layers had a width of 0.5 mm, and a thickness of 1.5 nm. Then, a collector is formed so as to cover prescribed regions on the upper surface of the transparent conductive film and the two amorphous silicon layers. In this case, the bus bar electrode portion of the collector was formed so as to be in contact with the surfaces of each of the two amorphous silicon layers over the whole their length in the longitudinal direction and to cover the upper and side surfaces of each of the two amorphous silicon layers. The bus bar electrode portion was formed so as to be also in contact with the regions of the both sides of the region, where the amorphous silicon layer was formed, of the upper surface of the transparent conductive film. The configured part, which is composed of the amorphous silicon layer and the bus bar electrode portion, had a width of 1.5 mm, and a thickness of 40 μm in the state that the bus bar electrode portion was formed on the amorphous silicon layer.

EXAMPLE 5

A photovoltaic device according to an example 5 was configured similarly to the upper surface side of the photovoltaic device according to the foregoing fifth embodiment. Specifically, an i-type amorphous silicon layer, a p-type amorphous silicon layer, and a transparent conductive film of a 9 cm square were successively deposited on the upper surface of an n-type single-crystalline silicon substrate of a 10 cm square. Thus, a region, which is not covered with the transparent conductive film, the p-type amorphous silicon layer and the i-type amorphous silicon layer, with a width of 5 mm was formed on the upper surface in the vicinity of the periphery of the n-type single-crystalline silicon substrate. A collector, which had a bus bar electrode portion longer than the one side of the transparent conductive film, was formed on the upper surface of the transparent conductive film. The collector was configured so that parts of the bus bar electrode portion, which extended 2 mm from the both edges, were in contact with the n-type single-crystalline silicon substrate, respectively. The formed bus bar electrode portion had a width of 1.5 mm, and a thickness of 40 μm.

EXAMPLE 6

In a photovoltaic device according to an example 6, a transparent conductive film was formed by using ZnO doped with 3% by weight of $Al_2O_3$. Except this constitution, the photovoltaic device according to the example 6 was prepared similarly to the foregoing example 1.

COMPARATIVE EXAMPLE 1

Figure 24:
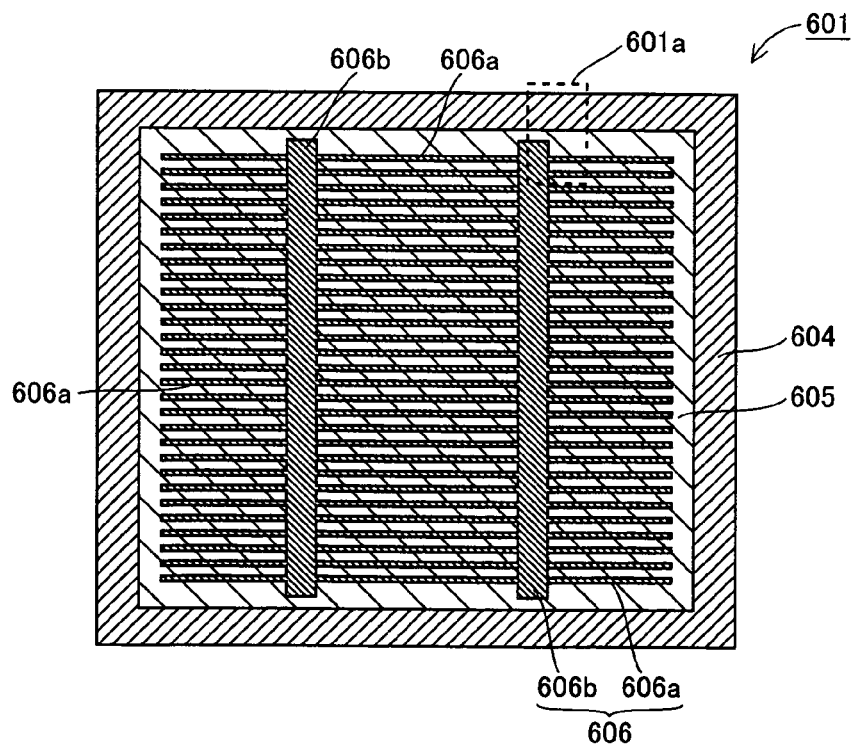
FIG. 24 is a plan view showing the whole constitution of the exemplary conventional photovoltaic device shown in FIG. 23.

A photovoltaic device of a comparative example 1 was configured similarly to the upper surface side of the exemplary conventional photovoltaic device (see FIG. 24) mentioned above. Specifically, an i-type amorphous silicon layer was formed so as to cover an n-type single-crystalline silicon substrate of a 10 cm square, and a p-type amorphous silicon layer was formed so as to cover the whole upper surface of the i-type amorphous silicon layer. Subsequently, a transparent conductive film of a 9 cm square was formed on the upper surface of the p-type amorphous silicon layer. Thus, a region, which was not covered with the transparent conductive film, with a width of 5 mm was formed on the upper surface in the vicinity of the periphery of the p-type amorphous silicon layer. Then, a collector was formed on the upper surface of the transparent conductive film. In this case, the collector was formed so as to be in contact only with the upper surface of the transparent conductive film. The formed bus bar electrode portion of the collector had a width of 1.5 mm, a thickness of 40 μm, and a length of 8.8 mm.

The adhesive strengths of the collectors were measured in the photovoltaic devices of the foregoing examples 1 to 4 and comparative example 1. The adhesive strength was measured twice before and after a moisture resistance test (humidity of 85%, and temperature of 85° C., for 2 hours). In this measurement, the adhesive strengths were measured in the samples of 100 sheets for each of the examples 1 to 4 and the comparative example 1, and then the average value of the measured adhesive strengths of 100 sheets for each example was calculated, thus, the value of the adhesive strength is normalized based on the calculated adhesive strength of the comparative example 1. The following Table 1 shows the result.

TABLE 1

| | Comp. Ex. 1 (Conv. Ex.) | Example 1 | Example 2 | Example 3 | Example 4 |
|---|---|---|---|---|---|
| Normalized Adhesive Strength Before Moisture Res. Test | 1 | 5.3 | 5.1 | 2.1 | 2.7 |
| Normalized Adhesive Strength After Moisture Res. Test | 1 | 18.3 | 18.7 | 6.3 | 9.3 |

The result of the above table 1 showed that the adhesive strengths of the examples 1 to 3 were much improved both before and after the moisture resistance test as compared with the comparative example 1. The reason was considered that, in each of the examples 1 to 3, the bus bar electrode portion of the collector was in partial contact with the p-type amorphous silicon layer whose adhesive strength for the collector is large as compared with that of the transparent conductive film for the collector. From this result, in order to keep peel-off of the collector in check, it was found that the bus bar electrode portion of the collector was preferably in partial contact with the p-type amorphous silicon layer. The above table 1 showed that the normalized adhesive strengths of the example 3 (before the moisture resistance test: 2.1, after the moisture resistance test: 6.3) were small as compared with the normalized adhesive strengths of the example 1 (before the moisture resistance test: 5.3, after the moisture resistance test: 18.3), and the normalized adhesive strengths of the example 2 (before the moisture resistance test: 5.1, after the moisture resistance test: 18.7). That is, in the example 3, it was found that the effect of keeping peel-off of the collector in check was small as compared with the examples 1 and 2. The reason was considered that, in the example 3 where the bus bar electrode portion was in contact with the p-type amorphous silicon layer through the groove, since the contact area of the part of the bus bar electrode portion in the vicinity of its end, which often became the starting point of peel-off of the collector, was small as compared with the examples 1 and 2, the effect of keeping peel-off of the collector in check became small as compared with the examples 1 and 2.

The result of the above table 1 also showed that the adhesive strengths of the example 4 were much improved both before and after the moisture resistance test as compared with the comparative example 1. The reason was considered that, in the example 4, the bus bar electrode portion of the collector was formed so as to cover the amorphous silicon layer whose adhesive strength for the collector is large as compared with that of the transparent conductive film for the collector. From this result, in order to keep peel-off of the collector in check, it was found that the amorphous silicon layer was preferably formed in the prescribed region on the transparent conductive film, and the bus bar electrode portion of the collector was formed so as to cover over the amorphous silicon. The above table 1 showed that the normalized adhesive strengths of the example 4 (before the moisture resistance test: 2.7, after the moisture resistance test: 9.3) were small as compared with the normalized adhesive strengths of the example 1 (before the moisture resistance test: 5.3, after the moisture resistance test: 18.3), and the normalized adhesive strengths of the example 2 (before the moisture resistance test: 5.1, after the moisture resistance test: 18.7). That is, in the example 4, it was found that the effect of keeping peel-off of the collector in check was small as compared with the examples 1 and 2. The reason was considered that, in the example 4, since the contact area of the part of the bus bar electrode portion in the vicinity of its end, which often became the starting point of peel-off of the collector, was small as compared with the contact areas of the parts of the bus bar electrode portions of the examples 1 and 2 in the vicinity of its end, the effect of keeping peel-off of the collector in check was small as compared with the examples 1 and 2.

Next, the yields of tab attachment where 12 sheets of photovoltaic devices were connected in series with a tab were measured by using the photovoltaic devices of the foregoing examples 1 to 4 and comparative example 1. The yield was measured by using 12000 sheets (1000 sets) of photovoltaic devices for each of the examples 1 to 4 and comparative example 1. The following Table 2 shows the result.

TABLE 2

| | Comp. Ex. 1 (Conv. Ex.) | Example 1 | Example 2 | Example 3 | Example 4 |
|---|---|---|---|---|---|
| Yield of Tab Attachment (%) | 98.7 | 99.9 | 99.7 | 99.8 | 99.8 |

The result of the above table 2 showed that the yields (example 1: 99.9%, example 2: 99.7%, example 3: 99.8%, example 4: 99.8%) of the examples 1 to 4 were high as compared with the yield (98.7%) of the comparative example 1, respectively. The reason was considered that, in the photovoltaic device of the examples 1 to 4, since the adhesive strengths of the collectors were large as compared with the photovoltaic device of the comparative example 1, peel-off of the collector was kept in check. From this result, it was found that when the bus bar electrode portion of the collector was in partial contact with the amorphous silicon layer, the yield in modularization of a plurality of photovoltaic devices could be improved.

Next, in the photovoltaic devices according to the examples 5 and 6 and the comparative example 1, the adhesive strengths of the collectors before and after the moisture resistance test were measured similarly to the foregoing examples 1 to 4. The following Table 3 shows the result.

TABLE 3

| | Comp. Ex. 1 (Conv. Ex.) | Example 5 | Example 6 |
|---|---|---|---|
| Normalized Adhesive Strength Before Moisture Res. Test | 1 | 6.3 | 6.1 |
| Normalized Adhesive Strength After Moisture Res. Test | 1 | 28.1 | 18.8 |

The result of the above table 3 showed that the adhesive strengths of the example 5 were much improved both before and after the moisture resistance test as compared with the comparative example 1. The reason was considered that, in the example 5, the part of the bus bar electrode portion of the collector in the vicinity of its end was in contact with the n-type single-crystalline silicon substrate whose adhesive strength for the collector was larger than that of the transparent conductive film for the collector. From this result, it was found that the part of the bus bar electrode portion of the collector in the vicinity of its end was preferably in contact with the n-type single-crystalline silicon substrate as mentioned in the example 5 in order to improve the adhesive strength of the collector. Furthermore, when the part of the bus bar electrode portion of the collector in the vicinity of its end was in contact with the n-type single-crystalline silicon substrate as mentioned above, though the adhesive strength of the collector could be improved, the output characteristic of the photovoltaic device was reduced since recombination of many careers occurred in the boundary between the collector and the n-type single-crystalline silicon substrate which was a power generating layer.

From the results of above Tables 1 and 3, it was found that, in the photovoltaic device of the example 6, the adhesive strengths (before the moisture resistance test: 6.1, after the moisture resistance test: 18.8) as large as the adhesive strengths (before the moisture resistance test: 5.3, after the moisture resistance test: 18.3) of the photovoltaic device of the example 1 could be obtained. From this result, it was found that, also in the case where the transparent conductive film consisted of a material such as ZnO doped with $Al_2O_3$ other than ITO, when the part of the bus bar electrode portion of the collector in the vicinity of its end was in contact with the p-type amorphous silicon layer, the peel-off of the collector could be kept in check. It was considered that, in the photovoltaic device of each of the examples 5 and 6, since peel-off of the collector was kept in check, the yield of tab attachment in modularization of the photovoltaic devices could be easily improved similarly to the foregoing examples 1 to 3.

It should be appreciated, however, that the embodiments and examples described above are illustrative, the invention is not specifically limited to description above. The invention is defined not by the foregoing description of the embodiments and examples, but by the appended claims, their equivalents, and various modifications that can be made without departing from the scope of the invention as defined in the appended claims.

For example, though the photovoltaic device having the structure where the i-type amorphous silicon layer and the p-type amorphous silicon layer are formed on the n-type single-crystalline silicon substrate is described in the foregoing embodiment, the invention is not limited to this structure, but the invention is applicable to other the photovoltaic devices having other structures.

Although the adhesive strength of the collector were measured in the case where the collector was in partial contact with the p-type amorphous silicon layer in the test for evaluating effect of the foregoing embodiments, the invention is not limited to this, but similar effects can be obtained in the case where a collector is in partial contact with an n-type amorphous silicon layer. This has been evaluated by the inventors of the present invention.

Although silicon (Si) is used as a semiconductor material in the foregoing embodiments, the present invention is not limited to this, but any semiconductor of SiGe, SiGeC, SiC, SiN, SiGeN, SiSn, SiSnN, SiSnO, SiO, Ge, GeC and GeN may be used. In this case, these semiconductors can be crystalline semiconductors, or amorphous semiconductors or microcrystalline semiconductors containing at least one of hydrogen and fluoride.

Although the indium oxide (ITO) doped with Sn is used in the foregoing embodiments as a material which composes the transparent conductive film, the present invention is not limited to this material, but a transparent conductive film consisting of a material other than ITO film may be used. For example, a transparent conductive film formed by using a target, which is produced by firing indium oxide powder ($In_2O_3$) mixed with a certain amount of at least one of Zn, As, Ca, Cu, F, Ge, Mg, S, Si, and Te as compound powder, can be used.

Although the amorphous silicon layer is formed by a RF plasma CVD process in the foregoing embodiments, the present invention is not limited to this process, but an amorphous silicon layer may be formed by another process such as evaporation, sputtering, microwave plasma CVD, ECR, thermal CVD or LPCVD (low-pressure CVD).

Although Ar gas is employed for sputtering the ITO film which constitutes the transparent conductive film in foregoing embodiments, the present invention is not limited to this, another inert gas such as He, Ne, Kr or Xe, or a gas mixture of them may be employed.

Although DC electric power is used in discharge operation for sputtering in the foregoing embodiments, the present invention is not limited to this, but pulse modulation DC discharge, RF discharge, VHF discharge, microwave discharge, or the like may be used.

Although the width of the opening of the transparent conductive film is larger than the width of the bus bar electrode portion in the foregoing second embodiment, the present invention is not limited to this, but the width of an opening of the transparent conductive film may be smaller than the width of a bus bar electrode portion.

Although the opening is recessed in a rectangular shape in the transparent conductive film in the foregoing second embodiment, the present invention is not limited to this shape, but an opening may be recessed in a triangular shape, a circular shape, and so on, in a transparent conductive film. As long as a bus bar electrode portion of a collector can be in contact with the semiconductor layer formed on the lower side of the transparent conductive film, any shape of opening can achieve effects similar to the foregoing second embodiment.

Although the groove is formed in the transparent conductive film so as to linearly extend in the foregoing third embodiment, the present invention is not limited to this, but a groove may be formed in a transparent conductive film in any other shape such as a dashed line. In this case, effects similar to the foregoing third embodiment can be obtained.

Although the amorphous silicon layer is formed as the i-type layer on the transparent conductive film in the foregoing fourth embodiment, the present invention is not limited to this, but such an amorphous silicon layer may be an n-type layer. When an amorphous silicon layer is formed as an n-type layer, the resistance of the amorphous silicon layer can be small, therefore, large reduction of output characteristic due to the resistance of the amorphous silicon layer can be kept in check. In the case where a transparent conductive film is an n-type layer, when an amorphous silicon layer is formed as an n-type layer by introducing an n-type impurity into the amorphous silicon layer, the contact resistance between the amorphous silicon layer and the transparent conductive film can be reduced, thus, reduction of output characteristic can be further kept in check.

Although the amorphous silicon layer is formed so as to linearly extend, and is composed of one continuous layer, in the foregoing fourth embodiment, the present invention is not limited to this, but an amorphous silicon layer to be formed on a transparent conductive film may be formed in any of various types of shapes other than the above shape. For example, it may be formed in a discontinuous-shape such as a dotted shape, a dashed-line shape.

What is claimed is:

1. A photovoltaic device comprising:
a single-crystalline silicon substrate;

a non-single-crystalline semiconductor layer, which is formed on an upper surface of said single-crystalline silicon substrate;

a transparent conductive film which is formed on an upper surface of said non-single-crystalline semiconductor layer; and a collector which is formed on an upper surface of said transparent conductive film, wherein said transparent conductive film is formed so as to expose the periphery of the upper surface of said non-single-crystalline semiconductor layer on the side of said collector, the periphery including an edge of the photovoltaic device, said collector is formed so as to be in contact with the exposed upper surface of said non-single-crystalline semiconductor layer on the side of said collector, said collector includes first electrode portions for collecting currents and a second electrode portion for aggregating said currents collected by said first electrode portions, formed so as to connect with said first electrode portions, said second electrode portion is formed so as to extend in a prescribed direction in plane view and a part of said second electrode portion in the vicinity of its end in the longitudinal direction thereof extending in said prescribed direction is in direct contact with both an upper surface of said non-single-crystalline semiconductor layer and a surface of a side edge of the transparent conductive film, and the remaining part of said second electrode portion is in contact with the upper surface of said transparent conductive film.

2. The photovoltaic device according to claim 1, wherein said non-single-crystalline semiconductor layer includes an amorphous silicon layer.

3. The photovoltaic device according to claim 1, wherein said single-crystalline silicon substrate is a first conductivity type single-crystalline silicon substrate, said non-single-crystalline semiconductor layer includes a substantially intrinsic first non-single-crystalline semiconductor layer formed on the upper surface of said single-crystalline silicon substrate, and a second conductivity type second non-single-crystalline semiconductor layer formed on the upper surface of said first non-single-crystalline semiconductor layer, and said collector is in partial contact with the upper surface of said second non-single-crystalline semiconductor layer.

4. The photovoltaic device according to claim 3, wherein said first non-single-crystalline semiconductor layer and said second non-single-crystalline semiconductor layer include amorphous silicon layers.

5. The photovoltaic device according to claim 1, wherein parts of said second electrode portion in the vicinities of both its ends in the longitudinal direction thereof are in contact with said non-single-crystalline semiconductor layer.

6. The photovoltaic device according to claim 1, wherein said transparent conductive film includes an opening, which is recessed in a plan view, on a part of the outer side surface of said transparent conductive film, and said collector is in contact with said non-single-crystalline semiconductor layer through the opening of said transparent conductive film.

7. The photovoltaic device according to claim 6, wherein at least a part of said opening is formed in a region shaded by said collector.

8. A photovoltaic device comprising:

a single-crystalline silicon substrate;

a non-single-crystalline semiconductor layer, which is formed on an upper surface of said single-crystalline silicon substrate;

a transparent conductive film, which is formed on an upper surface of said non-single-crystalline semiconductor layer; and a collector which is formed on an upper surface of said transparent conductive film, wherein said non-single-crystalline semiconductor layer and said transparent conductive film are formed so as to partially expose the upper surface of said single-crystalline silicon substrate on the side of said collector, and said collector is formed so as to be in direct contact with both the exposed upper surface of said single-crystalline silicon substrate on the side of said collector and the upper surface of the transparent conductive film.

* * * * *